United States Patent
Huang et al.

(10) Patent No.: US 12,224,740 B2
(45) Date of Patent: Feb. 11, 2025

(54) LOAD SWITCH INCLUDING BACK-TO-BACK CONNECTED TRANSISTORS

(71) Applicant: Nuvolta Technologies (Hefei) Co., Ltd., Hefei (CN)

(72) Inventors: Jinbiao Huang, Nashua, NH (US); John Lin, Carlsbad, CA (US)

(73) Assignee: Nuvolta Technoloiges (Heifei) Co., Ltd., Hefei (CN)

( * ) Notice: Subject to any disclaimer, the term of this patent is extended or adjusted under 35 U.S.C. 154(b) by 682 days.

(21) Appl. No.: 17/404,284

(22) Filed: Aug. 17, 2021

(65) Prior Publication Data

US 2022/0166426 A1 May 26, 2022

Related U.S. Application Data

(63) Continuation-in-part of application No. 17/382,800, filed on Jul. 22, 2021, now Pat. No. 11,923,837.

(60) Provisional application No. 63/118,342, filed on Nov. 25, 2020.

(51) Int. Cl.
| | |
|---|---|
| *H01L 21/762* | (2006.01) |
| *H01L 21/8234* | (2006.01) |
| *H01L 27/088* | (2006.01) |
| *H01L 29/00* | (2006.01) |
| *H01L 29/78* | (2006.01) |
| *H03K 17/687* | (2006.01) |

(52) U.S. Cl.
CPC ..... *H03K 17/687* (2013.01); *H01L 21/76205* (2013.01); *H01L 21/76224* (2013.01); *H01L 21/823481* (2013.01); *H01L 27/088* (2013.01); *H01L 29/00* (2013.01); *H01L 29/7816* (2013.01)

(58) Field of Classification Search
CPC . H01L 29/00; H01L 29/0649; H01L 29/0692; H01L 29/402; H01L 29/66681; H01L 29/7831
USPC ........................................................ 257/330
See application file for complete search history.

(56) References Cited

U.S. PATENT DOCUMENTS

| | | |
|---|---|---|
| 7,345,342 B2 | 3/2008 | Challa et al. |
| 7,457,092 B2 | 11/2008 | Chang et al. |
| 9,362,366 B2 | 6/2016 | Yanase et al. |

(Continued)

FOREIGN PATENT DOCUMENTS

| | | |
|---|---|---|
| CN | 111446245 A | 7/2020 |
| JP | 2003258115 A | 9/2003 |

(Continued)

OTHER PUBLICATIONS

Office Action and Search Report received in Taiwanese Application No. 110143795, dated May 22, 2023, 2 pages.

(Continued)

*Primary Examiner* — Fazli Erdem
(74) *Attorney, Agent, or Firm* — AP3 Law Firm PLLC

(57) ABSTRACT

An apparatus includes a first drain/source region and a second drain/source region over a substrate, and a first gate adjacent to the first drain/source region, a second gate adjacent to the second drain/source region and a third gate between the first gate and the second gate, wherein the first drain/source region, the second drain/source region, the first gate, the second gate and the third gate form two back-to-back connected transistors.

12 Claims, 21 Drawing Sheets

(56) References Cited

U.S. PATENT DOCUMENTS

| | | | |
|---|---|---|---|
| 2007/0096205 A1* | 5/2007 | Ko | H01L 29/7835 |
| | | | 257/E29.264 |
| 2012/0175679 A1* | 7/2012 | Marino | H01L 29/7831 |
| | | | 257/E21.417 |
| 2012/0208329 A1 | 8/2012 | Bryant et al. | |
| 2013/0181285 A1* | 7/2013 | Ng | H01L 29/0649 |
| | | | 257/E29.264 |
| 2016/0141413 A1* | 5/2016 | Noh | H01L 29/408 |
| | | | 257/337 |
| 2018/0219533 A1* | 8/2018 | Khayat | H03K 19/018507 |
| 2019/0131296 A1* | 5/2019 | Murukesan | H01L 29/0696 |
| 2021/0159323 A1* | 5/2021 | Mehrotra | H01L 27/088 |

FOREIGN PATENT DOCUMENTS

| | | |
|---|---|---|
| JP | 2016134480 A | 7/2016 |
| KR | 20160055774 A | 5/2016 |

OTHER PUBLICATIONS

Office Action received in Korean Application No. 10-2021-0162174, dated Jan. 18, 2023, 10 pages.
Office Action received in Korean Application No. 10-2021-0162174, dated Jul. 8, 2023, 4 pages.

* cited by examiner

LOAD SWITCH INCLUDING BACK-TO-BACK CONNECTED TRANSISTORS

This application is a continuation-in-part of U.S. patent application Ser. No. 17/382,800, filed Jul. 22, 2021, and entitled "Load Switch Including Back-to-Back Connected Transistors," which claims the benefit of U.S. Provisional Application No. 63/118,342, filed on Nov. 25, 2020, entitled "Load Switch Including Back-to-Back Connected Transistors," each application is hereby incorporated herein by reference.

TECHNICAL FIELD

The present invention relates to a load switch, and, in particular embodiments, to a load switch including a pair of back-to-back connected transistors.

BACKGROUND

As semiconductor technologies evolve, metal oxide semiconductor field effect transistors (MOSFET) have been widely used in integrated circuits. MOSFETs are voltage controlled devices. When a control voltage is applied to the gate of a MOSFET and the control voltage is greater than the threshold of the MOSFET, a conductive channel is established between the drain and the source of the MOSFET. After the conductive channel has been established, a current flows between the drain and the source of the MOSFET. On the other hand, when the control voltage applied to the gate is less than the threshold of the MOSFET, the MOSFET is turned off accordingly.

MOSFETs may include two major categories, namely n-channel MOSFETs and p-channel MOSFETs. According to the structure difference, MOSFETs can be further divided into three sub-categories, planar MOSFETs, lateral double-diffused MOS (LDMOS) devices and vertical double-diffused MOSFETs. In comparison with other MOSFETs, the LDMOS device is capable of delivering more current per unit area because the asymmetric structure of the LDMOS device provides a short channel between the drain and the source of the LDMOS. In order to further improve the performance of the LDMOS device, a RESURF (REduced SURface Field) diffusion is placed in the drift region to increase the breakdown voltage of the LDMOS device for a given specific-on-resistance (Rsp).

A load switch is configured to connect a load to a power supply or disconnect the load from the power supply. The load switch may be controlled by an external signal. In operation, when the load switch is turned off, the load switch is able to block current from flowing in both directions. On the other hand, when the load switch is turned on, a conductive path is established between the load and the power supply. Through the conductive path, the current flows from the power supply to the load. The load switch may be implemented as an isolation switch having two back-to-back connected transistors. For a high voltage application (e.g., 24 V), each transistor may be implemented as an LDMOS device. The back-to-back connected LDMOS devices are able to achieve bidirectional current blocking.

The drawback of the existing high voltage load switch is the back-to-back connection of the LDMOS devices effectively quadruples the Rsp of the load switch because the device area and the on-resistance have been simultaneously doubled. As the semiconductor industry further advances, the load switch may be implemented on an integrated circuit. It is desirable to reduce the footprint of the load switch so as to improve the efficiency and cost of the integrated circuit.

SUMMARY

These and other problems are generally solved or circumvented, and technical advantages are generally achieved, by preferred embodiments of the present disclosure which provide a load switch including a pair of back-to-back connected transistors.

In accordance with an embodiment, an apparatus comprises a first drain/source region and a second drain/source region over a substrate, and a first gate adjacent to the first drain/source region, a second gate adjacent to the second drain/source region and a third gate between the first gate and the second gate, wherein the first drain/source region, the second drain/source region, the first gate, the second gate and the third gate form two back-to-back connected transistors.

In accordance with another embodiment, a method comprises in an off-state of a load switch comprising two back-to-back connected transistors, connecting a first gate and a second gate of the two back-to-back connected transistors to a first voltage potential lower than turn-on thresholds of the two back-to-back connected transistors, and connecting a third gate to a first source of the two back-to-back connected transistors, and in an on-state of the load switch, connecting the first gate and the second gate of the two back-to-back connected transistors to a second voltage potential higher than the turn-on thresholds of the two back-to-back connected transistors, and connecting the third gate to a third voltage potential higher than the turn-on thresholds of the two back-to-back connected transistors.

In accordance with yet another embodiment, a controller comprises a first gate driver configured to apply a first voltage potential to a first gate of a load switch in an off-state of the load switch and apply a second voltage potential to the first gate of the load switch in an on-state of the load switch, wherein the first voltage potential is lower than a turn-on threshold of a first switch of the load switch, and the second voltage potential is higher than the turn-on threshold of the first switch of the load switch, a second gate driver configured to apply the first voltage potential to a second gate of the load switch in the off-state of the load switch and apply the second voltage potential to the second gate of the load switch in the on-state of the load switch, and a third gate driver configured to connect a third gate of the load switch to a first source of the load switch in the off-state of the load switch and apply a third voltage potential to the third gate of the load switch in the on-state of the load switch, wherein the third voltage potential is higher than the turn-on threshold of the first switch of the load switch of the two back-to-back connected transistors.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to embodiments in a specific context, a load switch including a pair of back-to-back connected lateral double-diffused metal oxide semiconductor (LDMOS) devices. The embodiments of the disclosure may also be applied, however, to a variety of metal oxide semiconductor field effect transistors (MOSFETs).

Figure 1:
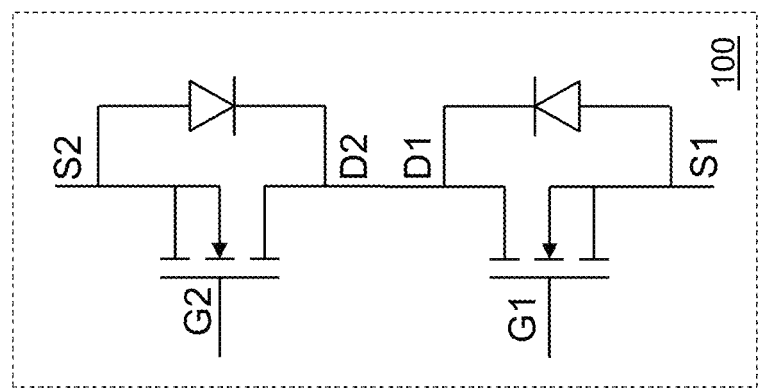
FIG. 1 illustrates a schematic diagram of shared-drain transistors in accordance with various embodiments of the present disclosure.

FIG. 1 illustrates a schematic diagram of shared-drain transistors in accordance with various embodiments of the present disclosure. A load switch may be implemented as two back-to-back connected LDMOS devices. These two LDMOS devices share a drain. Throughout the description, the load switch may be alternatively referred to as shared-drain transistors.

As shown in FIG. 1, the shared-drain transistors 100 comprise two back-to-back connected N-type transistors. A first transistor comprises a first drain D1, a first gate G1 and a first source S1. A second transistor comprises a second drain D2, a second gate G2 and a second source S2. The drains of these two N-type transistors are directly connected to each other as shown in FIG. 1. The back-to-back connected N-type transistors shown in FIG. 1 can be used as a load switch. The load switch is able to achieve bidirectional current blocking. As such, the load switch is also known as an isolation switch.

In operation, the source of the second transistor may be connected to a high voltage potential such as a bias voltage. The source of the first transistor may be connected to a low voltage potential. In this configuration, the second switch can be turned on when the second gate is driven by a voltage higher than the high voltage potential. A charge pump may be needed to provide a gate drive voltage higher than the high voltage potential.

In some embodiments, each transistor shown in FIG. 1 may be implemented as a lateral double-diffused MOS (LDMOS). The shared-drain transistors 100 may only have four terminals, namely a first gate terminal, a first source terminal, a second gate terminal and a second source terminal. As shown in FIG. 1, the drains of the two back-to-back connected N-type transistors are connected to each other. In other words, the drain is shared by the first transistor and the second transistor. The shared drain is floating as shown in FIG. 1. As such, the shared-drain transistors 100 do not comprise a drain terminal. The layout of the shared-drain transistors 100 may be improved through removing unnecessary drain regions such as drain diffusion regions, drain contacts, drain metal regions and the like. By removing unnecessary drain regions, the two transistors shown in FIG. 1 can be brought close to each other as possible while ensuring that the two gates (G1 and G2) are separated by the minimum spacing specified by the design rule. The detailed layout of the shared-drain transistors 100 will be described below with respect to FIGS. 2-3.

Figure 2:
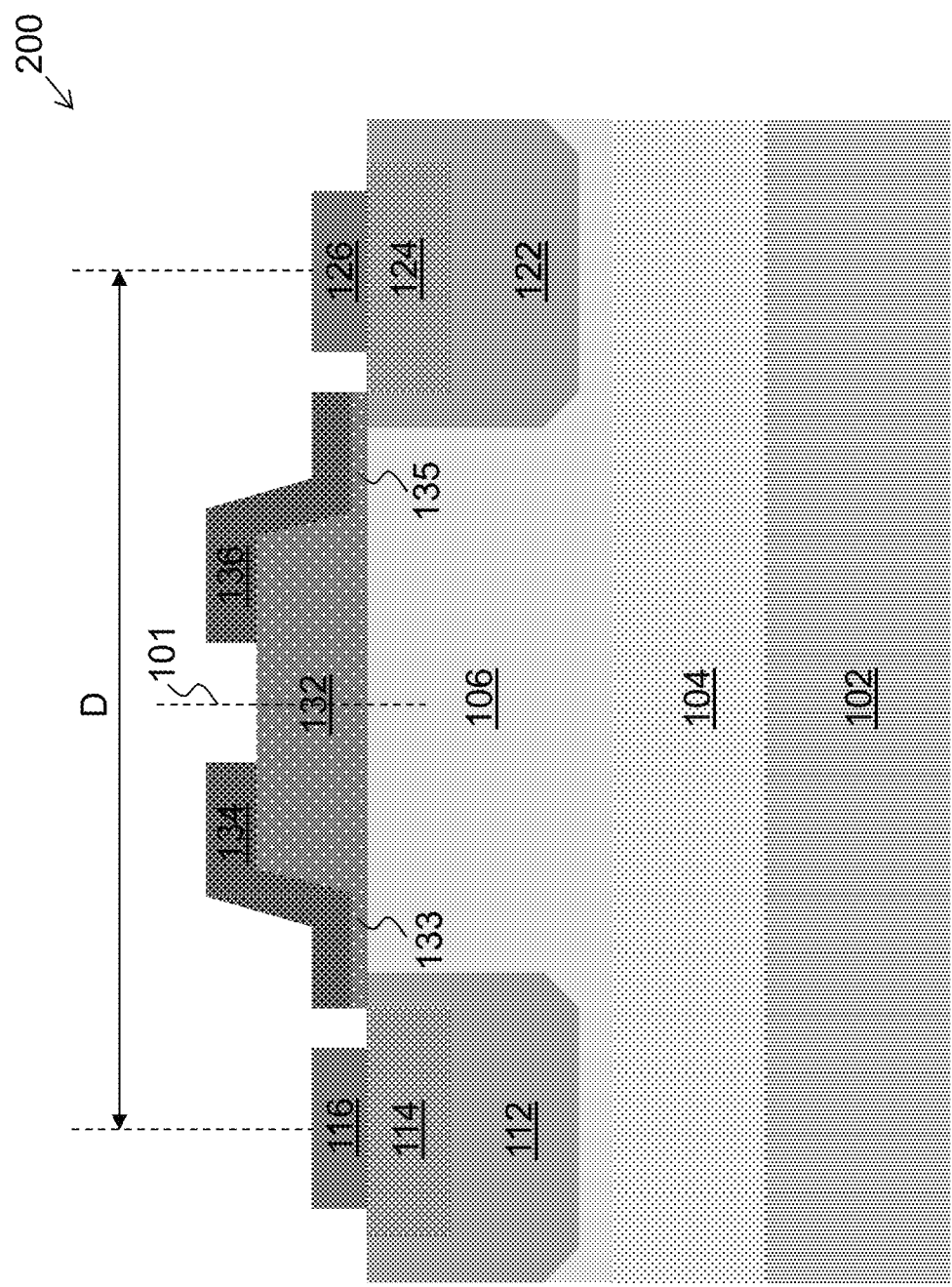
FIG. 2 illustrates a simplified cross-sectional view of a load switch formed by shared-drain LDMOS transistors in accordance with various embodiments of the present disclosure.

FIG. 2 illustrates a simplified cross-sectional view of a load switch formed by shared-drain LDMOS transistors in accordance with various embodiments of the present disclosure. The shared-drain LDMOS transistors 200 include a substrate 102, a first layer 104, a drift layer 106 formed over the first layer 104, a first body region 112 and a second body region 122 formed in the drift layer 106. The shared-drain LDMOS transistors 200 further comprise a first drain/source region 114 formed in the first body region 112, a second drain/source region 124 formed in the second body region 122, a first gate dielectric layer 133, a high voltage oxide region 132, a second gate dielectric layer 135, a first source contact 116, a first gate 134, a second gate 136 and a second source contact 126.

In some embodiments, the substrate 102, the first layer 104, the first body region 112 and the second body region 122 have a first conductivity type. The drift layer 106, the first drain/source region 114 and the second drain/source region 124 have a second conductivity type. In some embodiments, the first conductivity type is P-type, and the second conductivity type is N-type. The shared-drain LDMOS transistors 200 are formed by two n-type transistors. Alternatively, the first conductivity type is N-type, and the second conductivity type is P-type. The shared-drain LDMOS transistors 200 are formed by two p-type transistors.

The substrate 102 may be formed of suitable semiconductor materials such as silicon, silicon germanium, silicon carbide and the like. Depending on different applications and design needs, the substrate 102 may be N-type or P-type. In some embodiments, the substrate 102 is a P-type substrate. Appropriate P-type dopants such as boron and the like are doped into the substrate 102. Alternatively, the substrate 102 is an N-type substrate. Appropriate N-type dopants such as phosphorous and the like are doped into the substrate 102.

The first layer 104 may be implemented as a P-type epitaxial layer. Throughout the description, the first layer 104 may be alternatively referred to as the P-type epitaxial layer 104. The P-type epitaxial layer 104 is grown from the substrate 102. The epitaxial growth of the P-type epitaxial layer 104 may be implemented by using any suitable semiconductor fabrication processes such as chemical vapor deposition (CVD) and the like. In some embodiments, the P-type epitaxial layer 104 is of a doping density in a range from about $10^{14}/cm^3$ to about $10^{16}/cm^3$.

The drift layer 106 is an N-type layer formed over the first layer 104. In some embodiments, the drift layer 106 may be doped with an N-type dopant such as phosphorous to a doping density of about $10^{15}/cm^3$ to about $10^{17}/cm^3$. It should be noted that other N-type dopants such as arsenic, antimony, or the like, could alternatively be used. It should further be noted that the drift layer 106 may be alternatively referred to as an extended drift region.

The first body region 112 and the second body region 122 are P-type body regions. The P-type body regions may be formed by implanting P-type doping materials such as boron and the like. Alternatively, the P-type body regions can be formed by a diffusion process. In some embodiments, a P-type material such as boron may be implanted to a doping density of about $10^{16}/cm^3$ to about $10^{18}/cm^3$. The first body region 112 may be alternatively referred to as a first channel region. The second body region 122 may be alternatively referred to as a second channel region.

The first drain/source region 114 is a first N+ region formed in the first body region 112. The first drain/source region 114 may be alternatively referred to as the first N+ region 114. In accordance with an embodiment, the first N+ region 114 functions as a first source region of the shared-drain LDMOS transistors 200. The first source region may be formed by implanting N-type dopants such as phosphorous and arsenic at a concentration of between about $10^{19}/cm^3$ and about $10^{20}/cm^3$. Furthermore, a source contact 116 is formed over the first N+ region 114.

It should be noted that a P+ region (not shown but illustrated in FIG. 3) is formed adjacent to the first N+ region 114 in the first body region 112. The P+ region (e.g., P+ region 115 shown in FIG. 3) may be formed by implanting a P-type dopant such as boron at a concentration of between about $10^{19}/cm^3$ and about $10^{20}/cm^3$. The P+ region may contact the P-type body. In order to eliminate the body effect, the P+ region may be connected to the first source region (the first N+ region 114) directly through the first source contact 116.

The second drain/source region 124 is a second N+ region 124 formed in the second body region 122. The second drain/source region 124 may be alternatively referred to as the second N+ region 124. In accordance with an embodiment, the second N+ region 124 functions as a second source region of the shared-drain LDMOS transistors 200. The second source region may be formed by implanting N-type dopants such as phosphorous and arsenic at a concentration of between about $10^{19}/cm^3$ and about $10^{20}/cm^3$. Furthermore, a second source contact 126 is formed over the second N+ region 124.

It should be noted that a P+ region (not shown but illustrated in FIG. 3) is formed adjacent to the second N+ region 124 in the second body region 122. The P+ region (e.g., P+ region 125 shown in FIG. 3) may be formed by implanting a P-type dopant such as boron at a concentration of between about $10^{19}/cm^3$ and about $10^{20}/cm^3$. The P+ region may contact the p-type body. In order to eliminate the body effect, the P+ region may be connected to the second source region (the second N+ region 124) directly through the second source contact 126.

The first gate dielectric layer 133, the high voltage oxide region 132 and the second gate dielectric layer 135 are formed over the drift layer 106. As shown in FIG. 2, the first gate dielectric layer 133 is partially on top of the first body region 112, and partially on top of the drift layer 106. Likewise, the second gate dielectric layer 135 is partially on top of the second body region 122, and partially on top of the drift layer 106. The high voltage oxide region 132 is formed between the first gate dielectric layer 133 and the second gate dielectric layer 135. As shown in FIG. 2, the high voltage oxide region 132 is of a trapezoidal shape. It is within the scope and spirit of the present disclosure for the high voltage oxide region to comprise other shapes, such as, but not limited to square, rectangle and the like.

As shown in FIG. 2, the thickness of the high voltage oxide region 132 is much greater than the thickness of the first gate dielectric layer 133 and the second gate dielectric layer 135. In some embodiments, the first gate dielectric layer 133 and the second gate dielectric layer 135 are of a thickness of between about 100 Angstroms and about 200 Angstroms. The thickness of the high voltage oxide region 132 is about 5000 Angstroms. In some embodiments, the first gate dielectric layer 133, the high voltage oxide region 132 and the second gate dielectric layer 135 may be formed of suitable oxide materials such as silicon oxide, silicon oxynitride, hafnium oxide, zirconium oxide or the like.

The first gate 134 is formed on the first gate dielectric layer 133 and the high voltage oxide region 132. The second gate 136 is formed on the second gate dielectric layer 135 and the high voltage oxide region 132. The first gate 134 and the second gate 136 may be formed of polysilicon, polysilicon germanium, nickel silicide or other metal, metal alloy materials.

As shown in FIG. 2, the first gate 134 extends up onto the high voltage oxide region 132. The first gate 134 covers a first sidewall and a first edge portion of the high voltage oxide region 132. The combination of the first gate 134 and the high voltage oxide region 132 functions as a first field plate. This first field plate helps to maintain the breakdown voltage of the first transistor of the shared-drain LDMOS transistors 200. Likewise, the second gate 136 extends up onto the high voltage oxide region 132. The second gate 136 covers a second sidewall and a second edge portion of the high voltage oxide region 132. The combination of the second gate 136 and the high voltage oxide region 132 functions as a second field plate. This second field plate helps to maintain the breakdown voltage of the second transistor of the shared-drain LDMOS transistors 200.

The first gate 134 and the second gate 136 may be formed by depositing a polysilicon layer with a thickness of about 4000 Angstroms over the gate dielectric layers and the high voltage oxide region, depositing a photoresist layer over the polysilicon layer, developing the photoresist layer to define the first gate 134 and the second gate 136, etching the polysilicon layer to form gates 134 and 136.

As shown in FIG. 2, the first drain/source region 114 and the second drain/source region 124 are arranged in a symmetrical manner with respect to a center line 101 crossing the high voltage oxide region 132. The first gate 134 and the second gate 136 are arranged in a symmetrical manner with respect to the center line 101 crossing the high voltage oxide region 132.

In the conventional shared-drain LDMOS transistors, two LDMOS transistors are placed in a symmetrical manner with respect to the shared drain. Each LDMOS transistor has its own high voltage oxide region. The two high voltage oxide regions are separated by the drain contact. In accordance with the design rule of the 24 V LDMOS devices, the dimension of a single LDMOS transistor is about 2.16 um. The dimension of the two LDMOS transistors is about 4.32 um. It should be noted that the dimensions used in the previous example are selected purely for demonstration purposes and are not intended to limit the various embodiments of the present invention to any particular size dimensions. A skilled person in the art will appreciate that depending on different fabrication processes, there can be many variations of the dimension of the LDMOS.

As shown in FIG. 2, a single high voltage oxide region 132 is employed to replace the two high voltage oxide regions in the conventional shared-drain LDMOS transistors. Furthermore, the drain region and the drain contact have been removed. As a result of merging two high voltage oxide regions into one high voltage oxide region and removing the drain region and the drain contact, the two LDMOS transistors are brought close to each other.

As shown in FIG. 2, the dimension of the shared-drain LDMOS transistors 200 is denoted as D. In particular, D is the distance between the first source contact 116 and the second source contact 126. In accordance with the design rule of the 24 V LDMOS devices, D is about 3.15 um. The dimension of the shared-drain LDMOS transistors 200 is much smaller than the dimension (4.32 um) of the conventional shared-drain LDMOS transistors.

For the shared-drain LDMOS transistors formed by 24 V LDMOS devices, the area of the shared-drain LDMOS transistors shown in FIG. 2 is about 1.46 times the area of a single transistor. Rsp is equal to an area of a semiconductor device times the on resistance of the semiconductor device. The effective Rsp is obtained through a normalization process. Based on the normalization process, the effective Rsp of a single 24 V LDMOS device is equal to 1. According to the same normalization process, the effective Rsp of the shared-drain LDMOS transistors shown in FIG. 2 is equal to 2.92. In the conventional device, the effective Rsp is equal to 4. As such, the shared-drain LDMOS transistors shown in FIG. 2 represent a 27% Rsp improvement relative to the conventional device.

In operation, when a first gate voltage and a second gate voltage are applied to the first gate 134 and the second gate 136, respectively, and the gate voltages are greater than the threshold of the corresponding transistors. A first inversion layer is formed in the first body region 112. The first inversion layer couples the first N+ region 114 to the drift layer 106. A second inversion layer is formed in the second body region 122. The second inversion layer couples the second N+ region 124 to the drift layer 106. As a result of having the first inversion layer and the second inversion layer, a conductive channel is established between the first source region and the second source region. A current flows between the first source region and the second source region of the shared-drain LDMOS transistors. On the other hand, when the gate voltages are less than the threshold of the transistors, the shared-drain LDMOS transistors are turned off accordingly.

Figure 3:
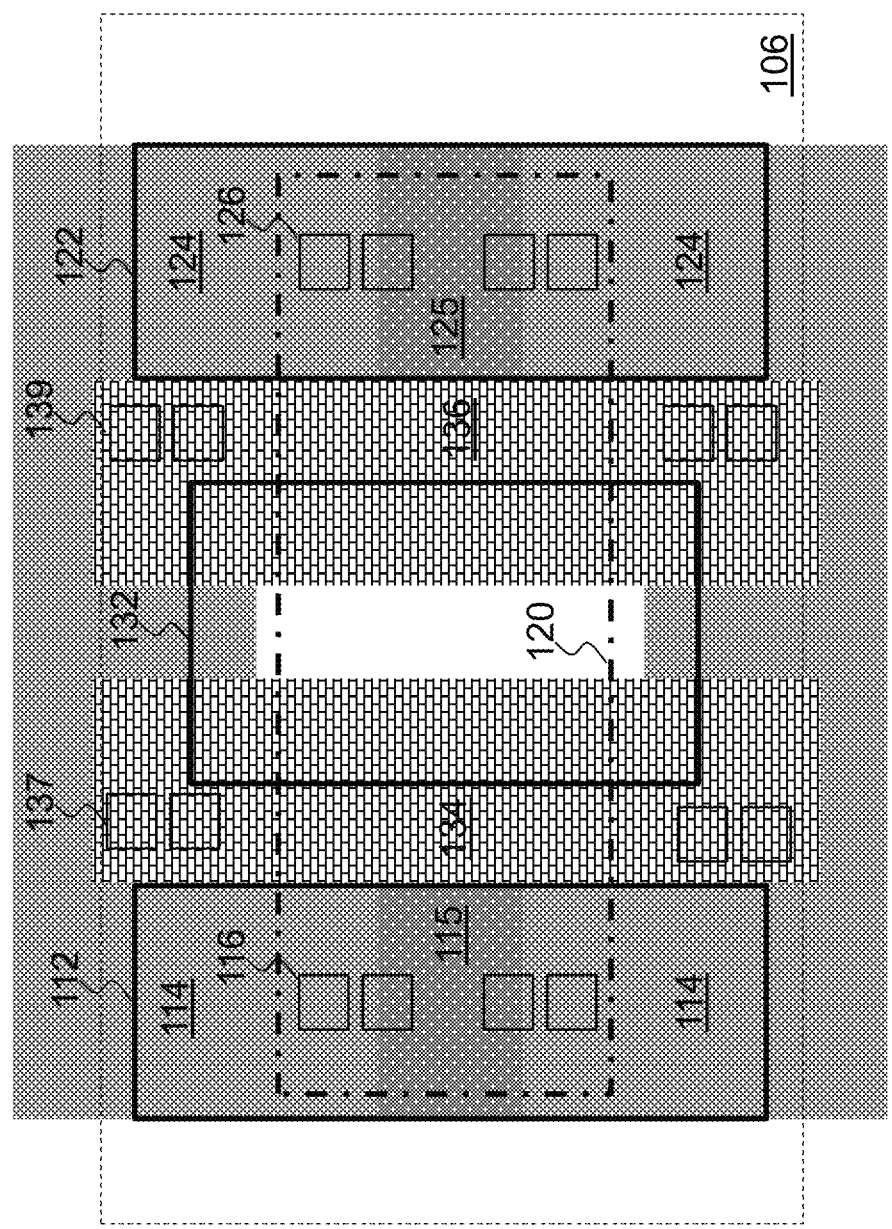
FIG. 3 illustrates a simplified top view of the load switch shown in FIG. 2 in accordance with various embodiments of the present disclosure.

FIG. 3 illustrates a simplified top view of the load switch shown in FIG. 2 in accordance with various embodiments of the present disclosure. Two U-shaped N+ regions are placed adjacent to each other. On the left side, a terminal portion of the first U-shaped N+ region and a terminal portion of the second U-shaped N+ region form the first source region 114 shown in FIG. 2. The first source region 114 is formed within the first body region 112. Likewise, on the right side, a terminal portion of the first U-shaped N+ region and a terminal portion of the second U-shaped N+ region form the second source region 124 shown in FIG. 2. The second source region 124 is formed within the second body region 122.

A first P+ region 115 is between two N+ regions of the first source region 114. The first P+ region 115 may contact the first p-type body region shown in FIG. 2. A plurality of first source contacts 116 are formed over the first P+ region 115 and the adjacent N+ regions. At least one source contact 116 couples the first P+ region 115 to the adjacent N+ regions.

It should be noted that while on the left side, there is one P+ region 115, the semiconductor device may comprise a plurality of P+ regions 115. More particularly, the N+ regions and the plurality of P+ regions may be formed in an alternating manner.

A second P+ region 125 is between two N+ regions of the second source region 124. The second P+ region 125 may contact the second p-type body region shown in FIG. 2. A plurality of second source contacts 126 are formed over the second P+ region 125 and the adjacent N+ regions. At least one source contact 126 couples the second P+ region 125 to the adjacent N+ regions.

It should be noted that while on the right side, there is one P+ region 125, the semiconductor device may comprise a plurality of P+ regions 125. More particularly, the N+ regions and the plurality of P+ regions may be formed in an alternating manner.

The high voltage oxide region 132 is placed between the first body region 112 and the second body region 122. The active region 120 of the shared-drain LDMOS transistors is orthogonal to the high voltage oxide region 132 as shown in FIG. 3. The first gate 134 is placed adjacent to the first source region 114. A plurality of first gate contacts 137 is formed over the first gate 134. The second gate 136 is placed adjacent to the second source region 124. A plurality of second gate contacts 139 is formed over the second gate 136. As shown in FIG. 3, the first gate 134 and the second gate 136 are separated from each other.

Figure 4:
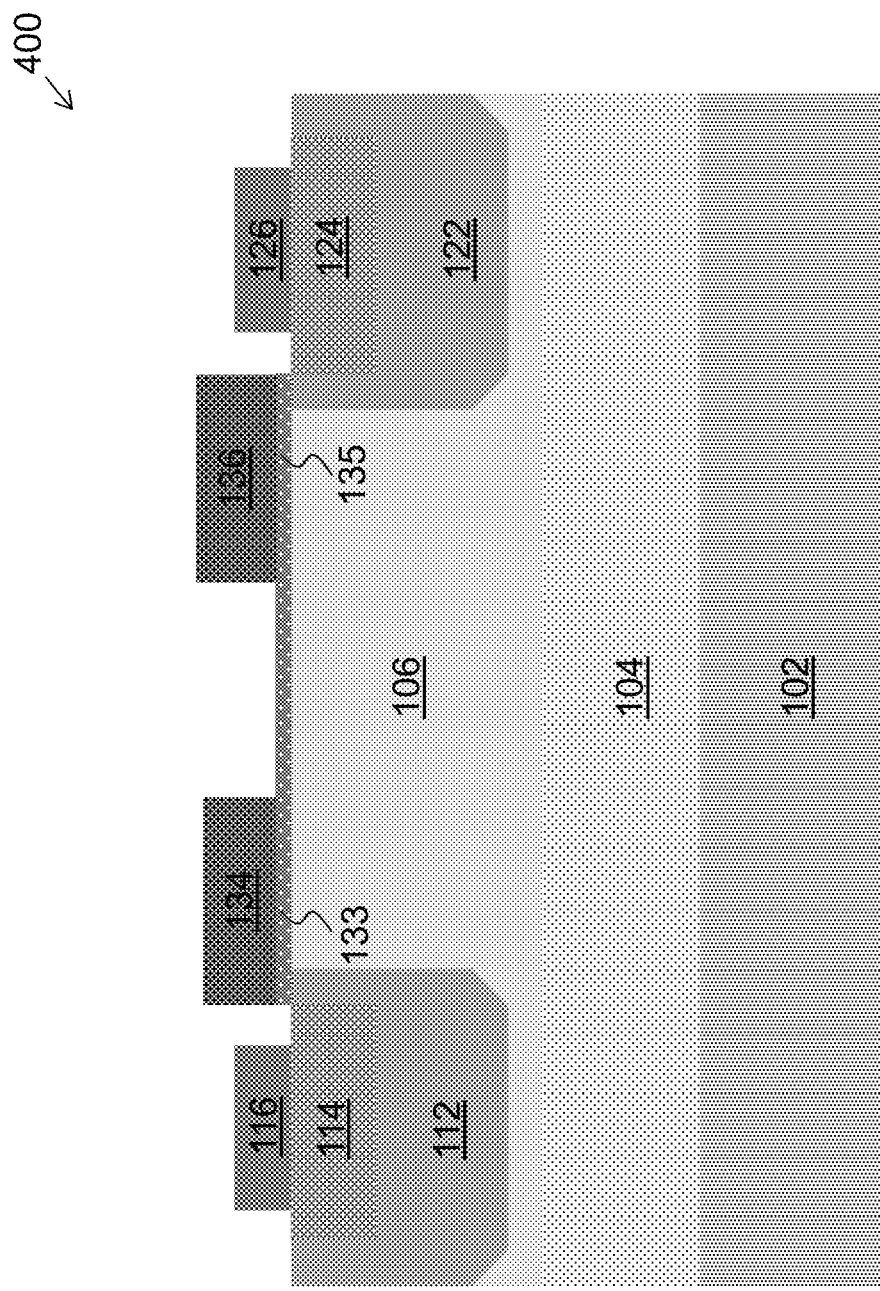
FIG. 4 illustrates a simplified cross-sectional view of another load switch formed by shared-drain LDMOS transistors in accordance with various embodiments of the present disclosure.

FIG. 4 illustrates a simplified cross-sectional view of another load switch formed by shared-drain LDMOS transistors in accordance with various embodiments of the present disclosure. The shared-drain LDMOS transistors 400 shown in FIG. 4 are similar to the shared-drain LDMOS transistors 200 shown in FIG. 2 except that the shared-drain LDMOS transistors 400 do not include a high voltage oxide region. As shown in FIG. 4, the first gate 134 and the second gate 136 are formed over the first gate dielectric layer 133 and the second gate dielectric layer 135 respectively. The first gate dielectric layer 133 and the second gate dielectric layer 135 are formed of a same material. The first gate dielectric layer 133 and the second gate dielectric layer 135 are collectively referred to as a gate dielectric layer. As shown in FIG. 4, the first gate 134 covers a first edge portion of the gate dielectric layer. The second gate 136 covers a second edge portion of the gate dielectric layer. The first gate 134 and the second gate 136 are separated from each other. The shared-drain LDMOS transistors 400 shown in FIG. 4 may be used in medium voltage applications such as 12 V applications.

Figure 5:
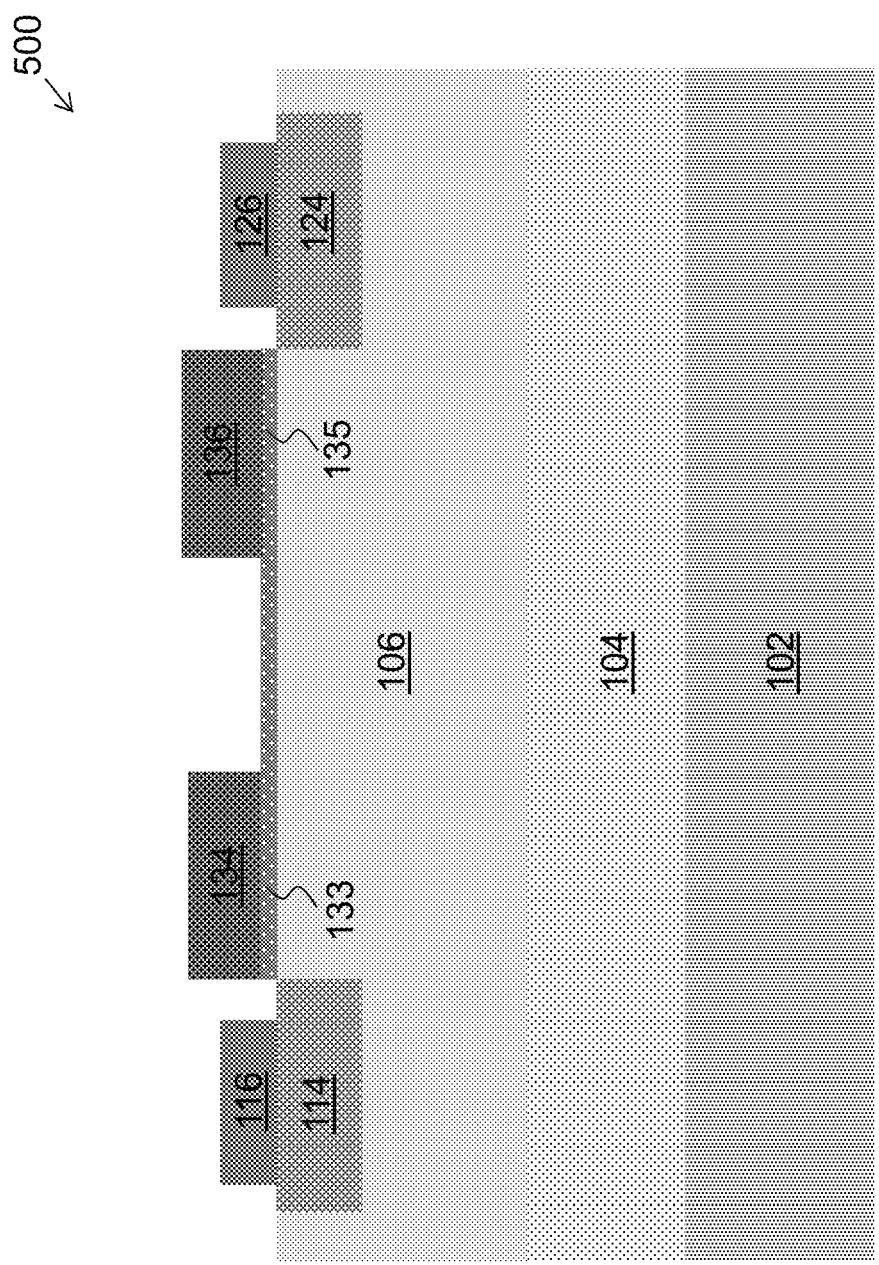
FIG. 5 illustrates a simplified cross-sectional view of another load switch formed by two transistors in accordance with various embodiments of the present disclosure.

FIG. 5 illustrates a simplified cross-sectional view of another load switch formed by two transistors in accordance with various embodiments of the present disclosure. The load switch 500 shown in FIG. 5 is formed by the same principle as that shown in FIG. 2 except that the load switch shown in FIG. 5 is used in low voltage applications such as 5 V applications.

In FIG. 5, an epitaxial layer 104 is formed over a substrate 102. A well 106 is formed over the epitaxial layer 104. A first drain/source region 114 and a second drain/source region 124 are formed in the well 106. In some embodiments, the substrate 102, the epitaxial layer 104, the well 106 have a first conductivity type. The first drain/source region 114 and the second drain/source region 124 have a second conductivity type. In some embodiments, the first conductivity type is P-type. The second conductivity type is N-type.

It should be noted that when the first drain/source region 114 and the second drain/source region 124 are implemented as source regions, the load switch is formed by two shared-drain transistors. On the other hand, when the first drain/source region 114 and the second drain/source region 124 are implemented as drain regions, the load switch is formed by two shared-source transistors.

Figure 6:
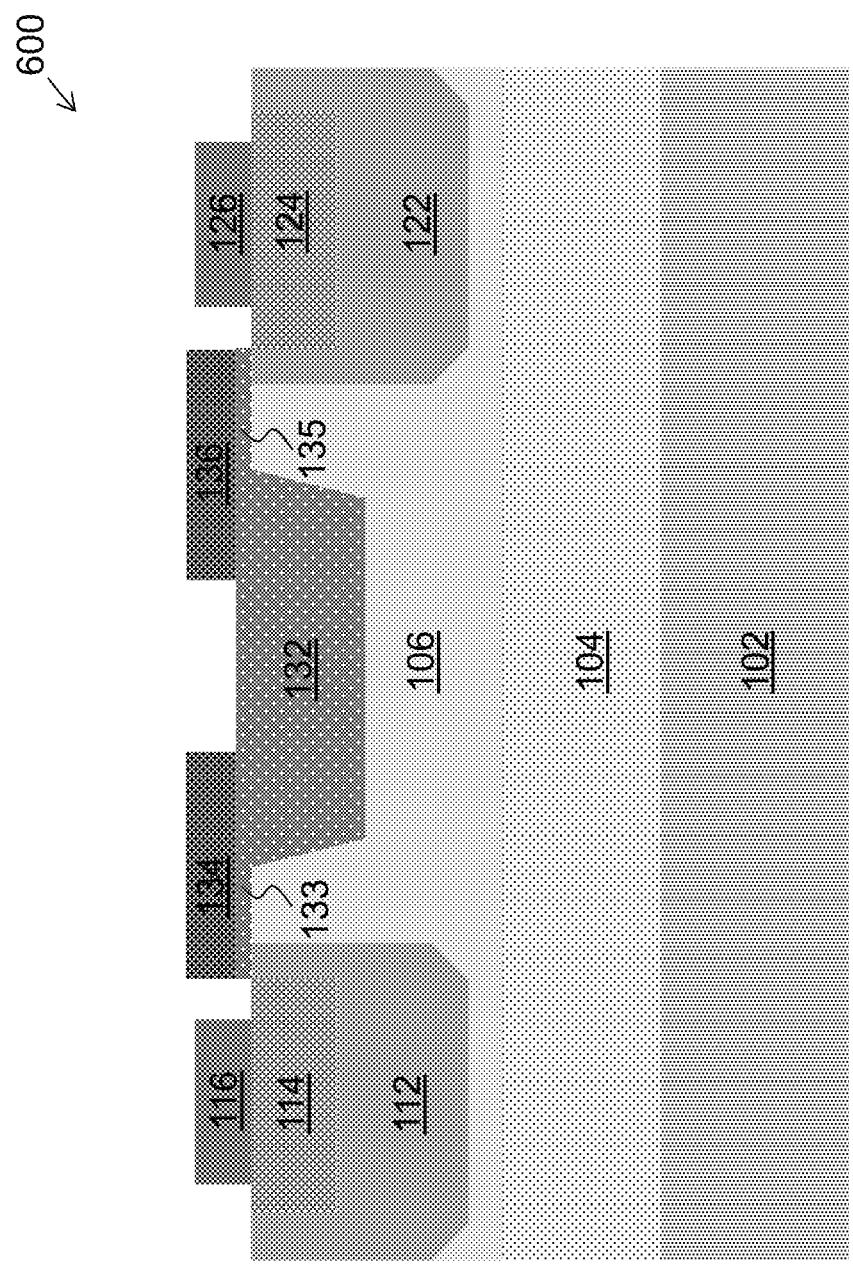
FIG. 6 illustrates a simplified cross-sectional view of another load switch formed by shared-drain LDMOS transistors in accordance with various embodiments of the present disclosure.

FIG. 6 illustrates a simplified cross-sectional view of another load switch formed by shared-drain LDMOS transistors in accordance with various embodiments of the present disclosure. The shared-drain LDMOS transistors 600 shown in FIG. 6 are similar to the shared-drain LDMOS transistors 200 shown in FIG. 2 except that the high voltage oxide region is replaced by a shallow trench isolation (STI) region. The LDMOS device with the STI region for improving the breakdown voltage is well known in the art, hence is not discussed again herein. As shown in FIG. 6, the STI region is of an inverted trapezoidal shape. The first gate 134 extends from an edge of the first drain/source region 114 and covers a first edge region of the STI region. The second gate 136 extends from an edge of the second drain/source region 124 and covers a second edge region of the STI region. The shared-drain LDMOS transistors 600 shown in FIG. 6 may be used in medium voltage applications such as 24 V applications.

Figure 7:
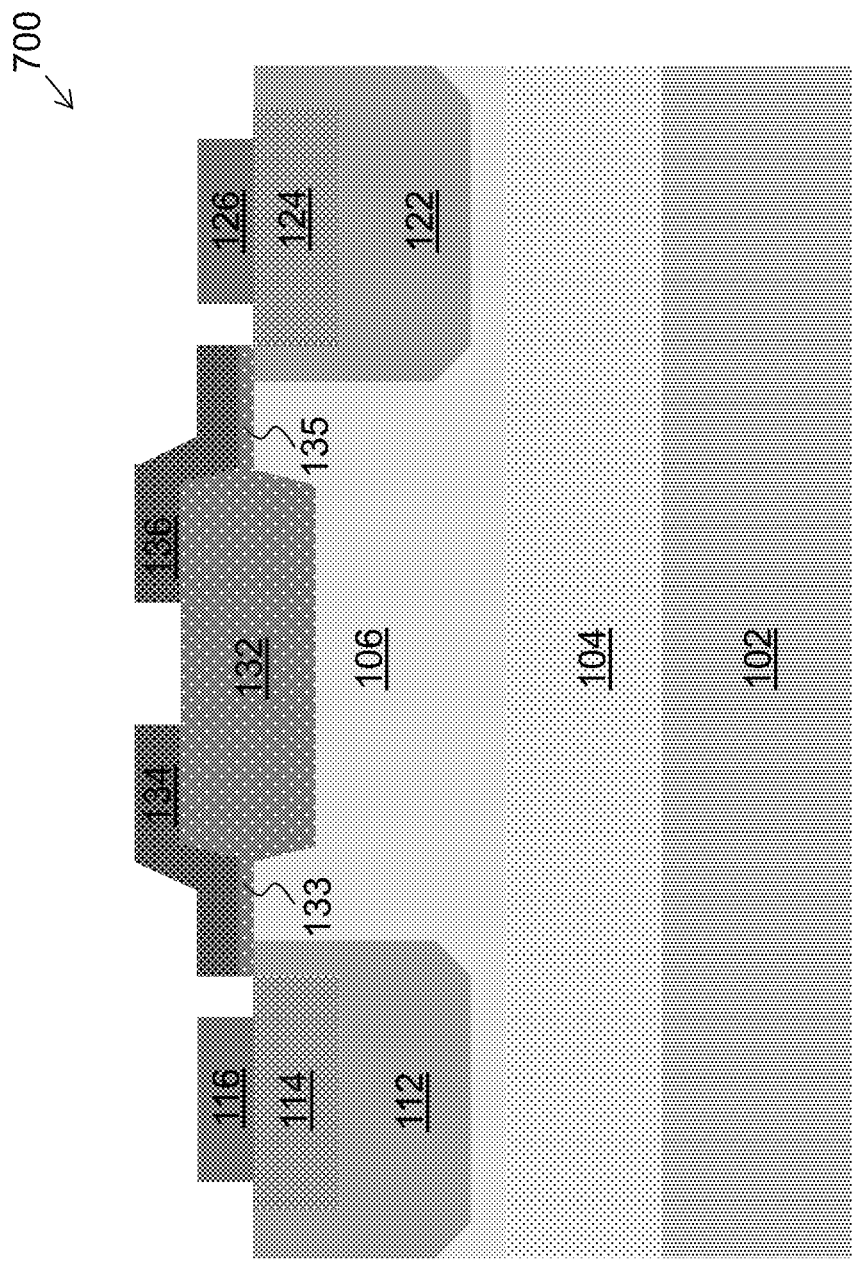
FIG. 7 illustrates a simplified cross-sectional view of another load switch formed by shared-drain LDMOS transistors in accordance with various embodiments of the present disclosure.

FIG. 7 illustrates a simplified cross-sectional view of another load switch formed by shared-drain LDMOS transistors in accordance with various embodiments of the present disclosure. The shared-drain LDMOS transistors 700 shown in FIG. 7 are similar to the shared-drain LDMOS transistors 200 shown in FIG. 2 except that the high voltage oxide region is replaced by a local oxidation of silicon (LOCOS) structure. The LOCOS structure has an upper portion over the drift layer 106, and a lower portion extending into the drift layer 106. As shown in FIG. 7, the first gate 134 is formed along an edge of the first drain/source region 114. The first gate 134 covers a first sidewall and a first edge portion of the LOCOS structure. The second gate 136 is formed along an edge of the second drain/source region 124. The second gate 136 covers a second sidewall and a second edge portion of the LOCOS structure.

The LDMOS device with the LOCOS structure for improving the breakdown voltage is well known in the art. As such, the detailed operating principle of this LDMOS device is not discussed again herein. The shared-drain LDMOS transistors 700 shown in FIG. 7 may be used in medium voltage applications such as 24 V applications.

Figure 8:
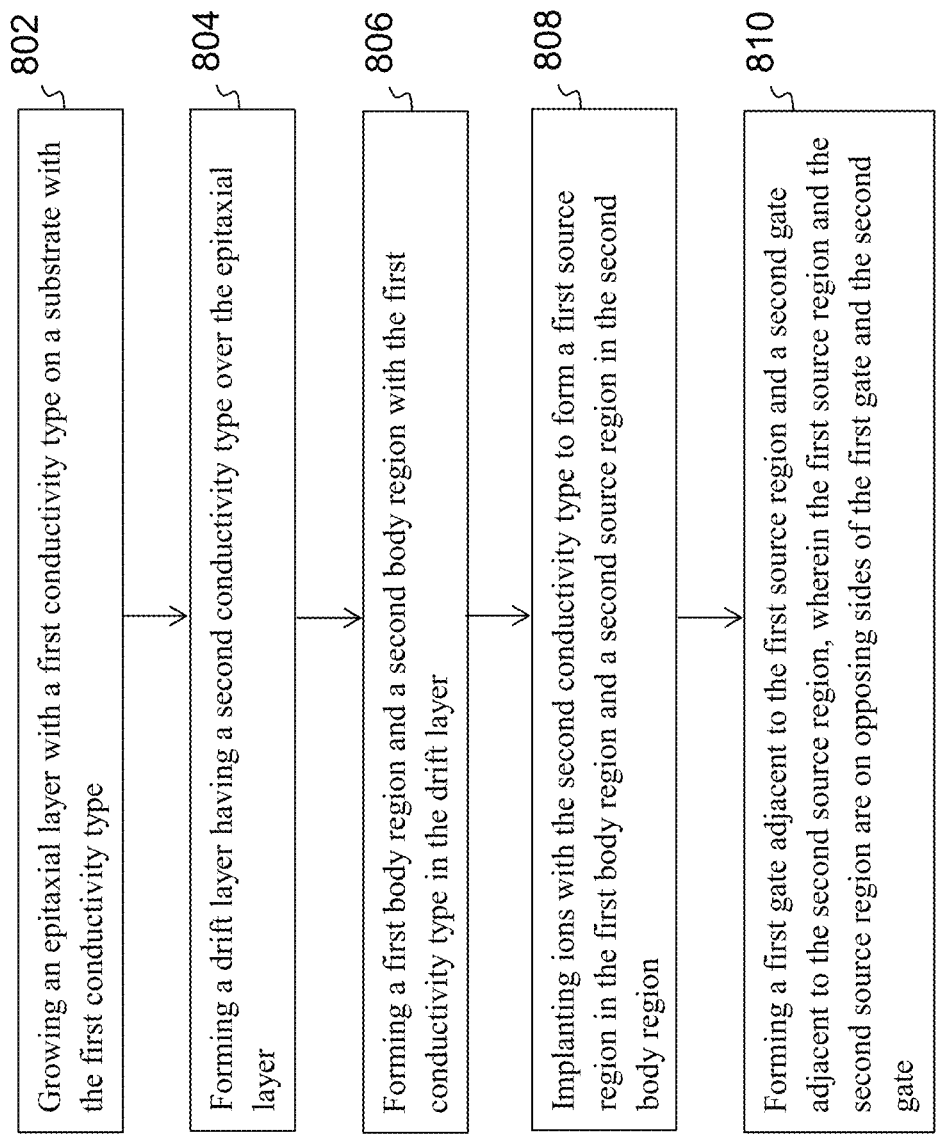
FIG. 8 illustrates a flow chart of a method for forming the shared-drain transistors shown in FIG. 1 in accordance with various embodiments of the present disclosure.

FIG. 8 illustrates a flow chart of a method for forming the shared-drain transistors shown in FIG. 1 in accordance with various embodiments of the present disclosure. This flowchart shown in FIG. 8 is merely an example, which should not unduly limit the scope of the claims. One of ordinary skill in the art would recognize many variations, alternatives, and modifications. For example, various steps illustrated in FIG. 8 may be added, removed, replaced, rearranged and repeated.

Referring back to FIG. 1, the shared-drain transistors comprise two back-to-back connected N-type transistors. A first transistor comprises a first drain, a first gate and a first source. A second transistor comprises a second drain, a second gate and a second source. The drains of these two N-type transistors are directly connected to each other as shown in FIG. 1. The back-to-back connected N-type transistors shown in FIG. 1 can be used as a load switch. The load switch is able to achieve bidirectional current blocking. The shared-drain transistors may be fabricated through the following steps.

At step 802, an epitaxial layer with a first conductivity type is grown over a substrate with the first conductivity type. In some embodiments, the first conductivity type is p-type. In other words, a P-type epitaxial layer is grown on a P-type substrate.

At step 804, a drift layer having a second conductivity type is formed over the epitaxial layer. In some embodiments, the second conductivity type is N-type. In other words, an N-type drift layer is formed over the P-type epitaxial layer.

At step 806, a first body region and a second body region with the first conductivity type are formed in the drift layer.

At step 808, ions with the second conductivity type are implanted in the first body region to form a first source region, and in the second body region to form a second source region.

At step 810, a first gate is formed adjacent to the first source region. A second gate is formed adjacent to the second source region. The first source region and the second source region are on opposing sides of the first gate and the second gate.

Referring back to FIG. 2, the method further comprises forming a high voltage oxide region over the drift layer, forming the gate of the first transistor along an edge of the source of the first transistor, wherein the gate of the first transistor covers a first sidewall and a first edge portion of the high voltage oxide region, and forming the gate of the second transistor along an edge of the source of the second transistor, wherein the gate of the second transistor covers a second sidewall and a second edge portion of the high voltage oxide region.

Referring back to FIG. 4, the method further comprises forming a gate dielectric layer from an edge of the first source to an edge of the second source, forming the gate of the first transistor covering a first edge portion of the gate dielectric layer, and forming the gate of the second transistor covering a second edge portion of the gate dielectric layer.

Referring back to FIG. 6, the method further comprises forming a shallow trench isolation (STI) region in the drift layer, forming the gate of the first transistor extending from an edge of the first source region and covering a first edge region of the STI region, and forming the gate of the second transistor extending from an edge of the second source region and covering a second edge region of the STI region.

Referring back to FIG. 7, the method further comprises forming a local oxidation of silicon (LOCOS) structure having a lower portion in the drift layer and an upper portion over the drift layer, forming the gate of the first transistor along an edge of the source of the first transistor, wherein the gate of the first transistor covers a first sidewall and a first edge portion of the LOCOS structure, and forming the gate of the second transistor along an edge of the source of the second transistor, wherein the gate of the second transistor covers a second sidewall and a second edge portion of the LOCOS structure.

Figure 9:
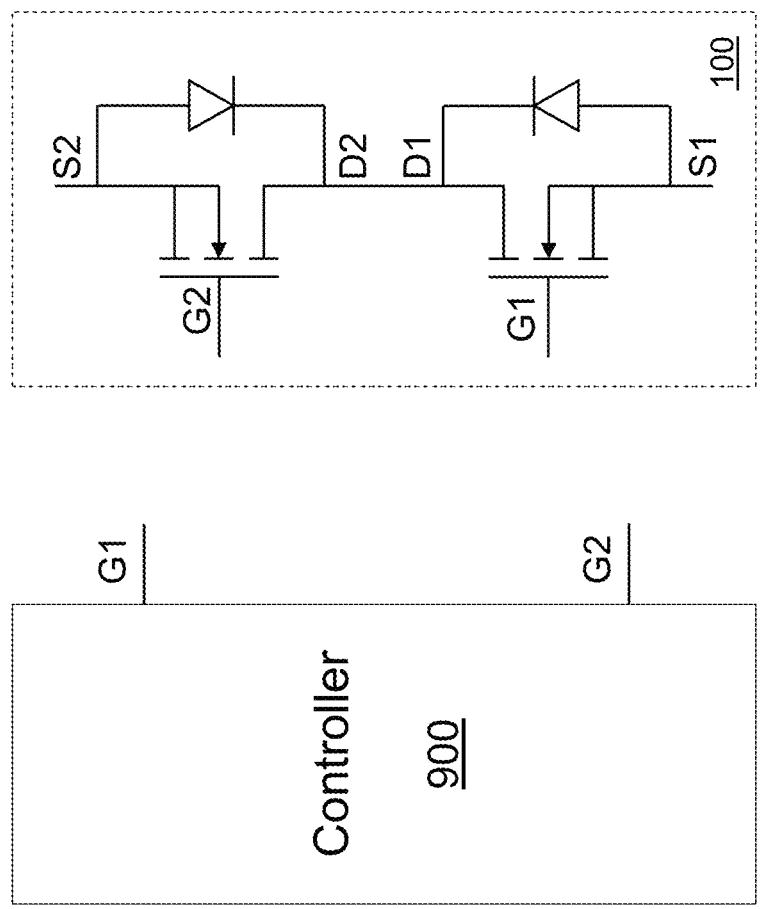
FIG. 9 illustrates a controller for driving the load switch shown in FIG. 1 in accordance with various embodiments of the present disclosure.

FIG. 9 illustrates a controller for driving the load switch shown in FIG. 1 in accordance with various embodiments of the present disclosure. The controller 900 comprises a first gate driver and a second a gate driver. The first gate driver is configured to generate a first gate drive signal applied to the first gate G1 of the first transistor. The second gate driver is configured to generate a second gate drive signal applied to the second gate G2 of the second transistor.

In operation, the first gate driver is configured to apply a first voltage potential to the first gate of the load switch in an off-state of the load switch, and apply a second voltage potential to the first gate of the load switch in an on-state of the load switch. The second gate driver is configured to apply the first voltage potential to the second gate of the load switch in the off-state of the load switch, and apply the second voltage potential to the second gate of the load switch in the on-state of the load switch. The first voltage potential is lower than the turn-on thresholds of the first transistor and the second transistor of the load switch. The second voltage potential is higher than the turn-on thresholds of the first transistor and the second transistor of the load switch.

It should be noted that the controller having two gate drivers described above is merely an example, which should not unduly limit the scope of the claims. One of ordinary skill in the art would recognize many variations, alternatives, and modifications. For example, a single gate driver may be used to drive both the first transistor and the second transistor.

Figure 10:
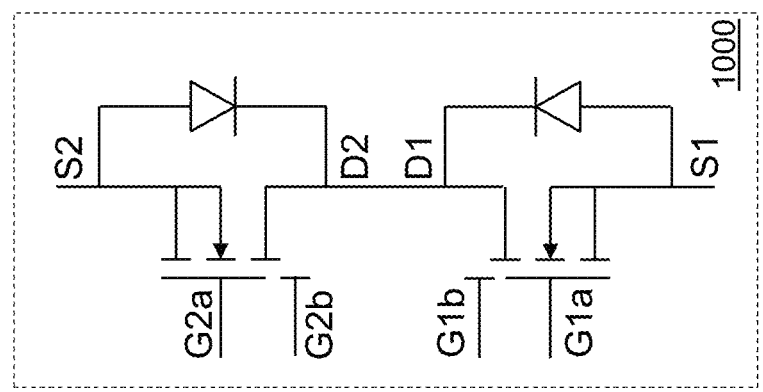
FIG. 10 illustrates a schematic diagram of a load switch having a split-gate structure in accordance with various embodiments of the present disclosure.

FIG. 10 illustrates a schematic diagram of a load switch having a split-gate structure in accordance with various embodiments of the present disclosure. The load switch 1000 is similar to the load switch 100 shown in FIG. 1 except that each transistor has a split-gate structure. As shown in FIG. 10, the first transistor has two gates, namely a first gate G1a and a third gate G1b. Likewise, the second transistor has two gates, namely a second gate G2a and a fourth gate G2b.

In operation, in an off-state of the load switch 1000, the first gate G1a and the second gate G2a are connected to a first voltage potential lower than the turn-on thresholds of these two transistors. In some embodiments, the first voltage potential is a ground voltage potential. The third gate G1b is connected to a first source S1. The fourth gate G2b is connected to the second source S2. In some embodiments, the third gate G1b and the fourth gate G2b are used as the field plates to provide the high voltage blocking capability.

In an on-state of the load switch 1000, the first gate G1a and the second gate G2a are connected to a second voltage potential higher than the turn-on thresholds of these two transistors. The third gate G1b and the fourth gate G2b are connected to a third voltage potential higher than the turn-on thresholds of these two transistors. In some embodiments, the third gate G1b and the fourth gate G2b are used as the additional gates to minimize the on resistance of the load switch 1000.

In some embodiments, the third voltage potential is equal to the second voltage potential. Alternatively, the third voltage potential is higher than the second voltage potential. The higher gate drive voltage applied to the third gate G1b and the fourth gate G2b helps to further reduce the on resistance of the load switch 1000.

Furthermore, in order to further improve the performance (e.g., power losses) of the load switch 1000, the gate drive signals may be applied to these four gates sequentially. In particular, in the on-state of the load switch 1000, the first gate G1a and the second gate G2a are connected to the second voltage potential prior to connecting the third gate G1b and the fourth gate G2b to the third voltage potential. In the off-state of the load switch 1000, the third gate G1b is connected to the first source S1 and the fourth gate G2b is connected to the second source S2 prior to connecting the first gate G1a and the second gate G2a to the first voltage potential.

Figure 11:
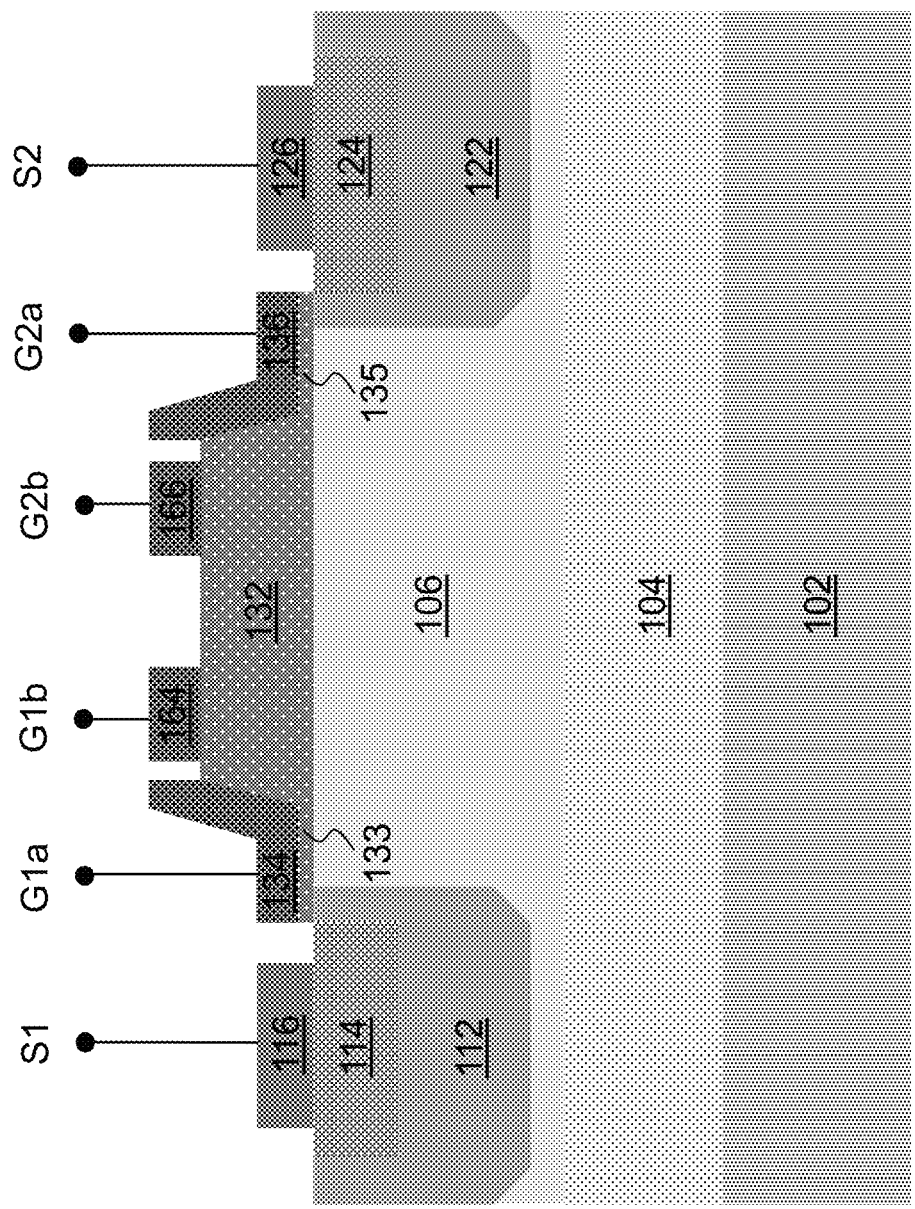
FIG. 11 illustrates a simplified cross-sectional view of a first implementation of the load switch shown in FIG. 10 in accordance with various embodiments of the present disclosure.

FIG. 11 illustrates a simplified cross-sectional view of a first implementation of the load switch shown in FIG. 10 in accordance with various embodiments of the present disclosure. The simplified cross-sectional view shown in FIG. 11 is similar to that shown in FIG. 2 except that the load switch comprises four gates, namely a first gate G1a, a second gate G2a, a third gate G1b and a fourth gate G2b.

As shown in FIG. 11, a high voltage oxide region 132 is formed over a substrate 102. A first gate dielectric layer 133 is formed between the high voltage oxide region 132 and a first drain/source region 114. A second gate dielectric layer 135 is formed between the high voltage oxide region 132 and the second drain/source region 124. In some embodiments, the first drain/source region 114 is the first source S1. The second drain/source region 124 is the second source S2. Throughout the description, the first drain/source region 114 is used interchangeably with the first source S1. Likewise, the second drain/source region 124 is used interchangeably with the second source S2.

The first gate G1a is connected to the first gate region 134. Throughout the description, the first gate G1a is used interchangeably with the first gate region 134. As shown in FIG. 11, the first gate 134 is formed over the first gate dielectric layer 133 and a first sidewall of the high voltage oxide region 132. The second gate G1b is connected to the second gate region 136. Throughout the description, the second gate G1b is used interchangeably with the second gate region 136. As shown in FIG. 11, the second gate 136 is formed over the second gate dielectric layer 135 and a second sidewall of the high voltage oxide region 132. The third gate G1b is connected to a third gate region 164. Throughout the description, the third gate G1b is used interchangeably with the third gate region 164. As shown in FIG. 11, the third gate 164 is formed on top of the high voltage oxide region 132. The fourth gate G2b is connected to a fourth gate region 166. Throughout the description, the fourth gate G2b is used interchangeably with the fourth gate region 166. As shown in FIG. 11, the fourth gate 166 is formed on top of the high voltage oxide region 132. As shown in FIG. 11, the third gate 164 and the fourth gate 166 are separated from each other.

As shown in FIG. 11, the first source 114 and the second source 124 are arranged in a symmetrical manner with respect to a dielectric region (e.g., high voltage oxide region 132) formed between the first source and the second source. Furthermore, the first gate 134 and the second gate 136 are arranged in a symmetrical manner with respect to the dielectric region. Moreover, the third gate 164 and the fourth gate 166 are arranged in a symmetrical manner with respect to a center line (not shown but illustrated in FIG. 2) crossing the high voltage oxide region 132.

Figure 12:
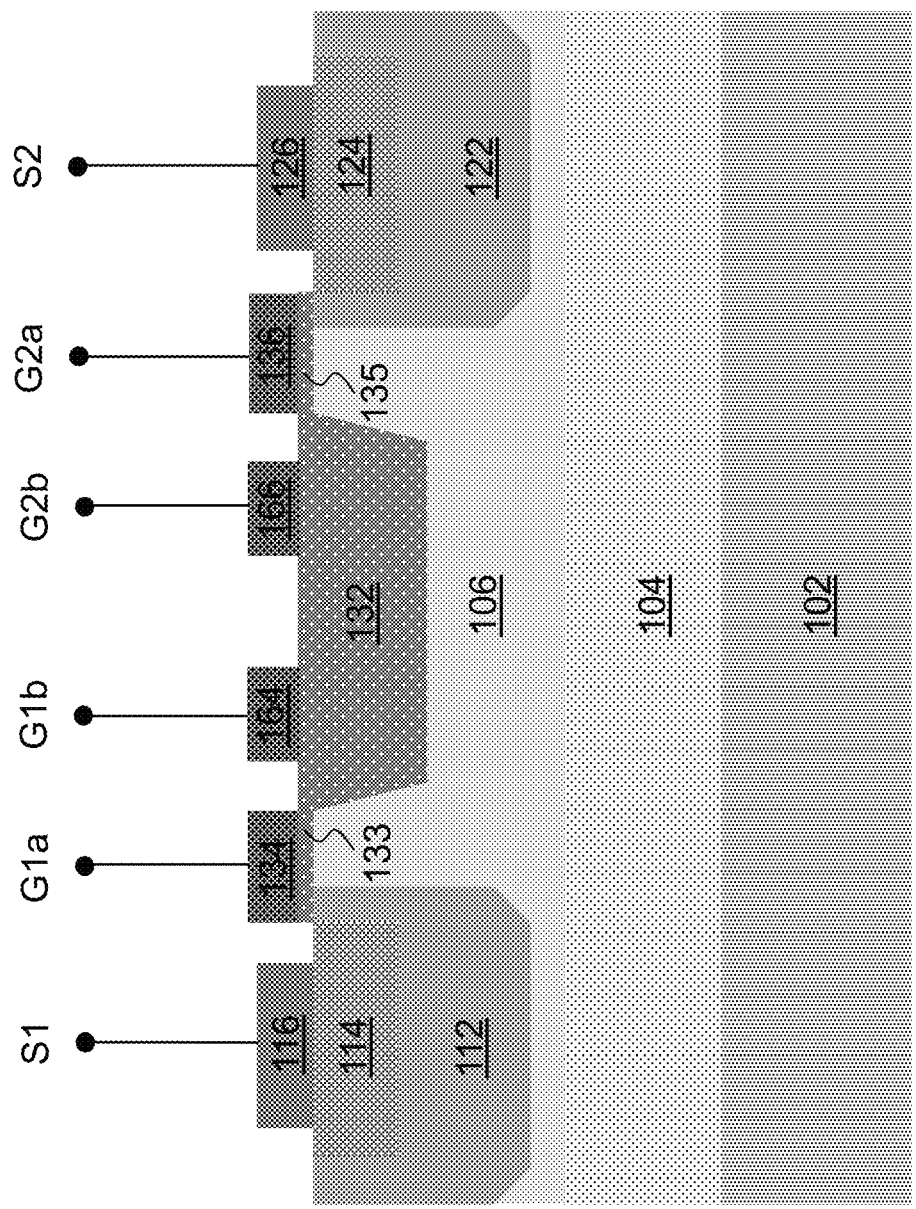
FIG. 12 illustrates a simplified cross-sectional view of a second implementation of the load switch shown in FIG. 10 in accordance with various embodiments of the present disclosure.

FIG. 12 illustrates a simplified cross-sectional view of a second implementation of the load switch shown in FIG. 10 in accordance with various embodiments of the present disclosure. The simplified cross-sectional view shown in FIG. 12 is similar to that shown in FIG. 11 except that the third gate 164 and the fourth gate 166 are formed over an STI region 132.

As shown in FIG. 12, a first gate dielectric layer 133 is formed between the STI region 132 and the first drain/source region 114. A second gate dielectric layer 135 is formed between the STI region 132 and the second drain/source region 124. The third gate 164 and the fourth gate 166 are formed between the first gate 134 and the second gate 136. The STI region 132 is formed over the substrate 102. The first gate 134 is over the first gate dielectric layer 133. In particular, the first gate 134 extends from an edge of the first drain/source region 114 and covers a first edge region of the STI region 132. The second gate 136 is over the second gate dielectric layer 135. In particular, the second gate 136 extends from an edge of the second drain/source region 124 and covers a second edge region of the STI region 132. The third gate 164 and the fourth gate 166 are formed on top of the STI region 132. As shown in FIG. 12, the third gate 164 and the fourth gate 166 are separated from each other.

Figure 13:
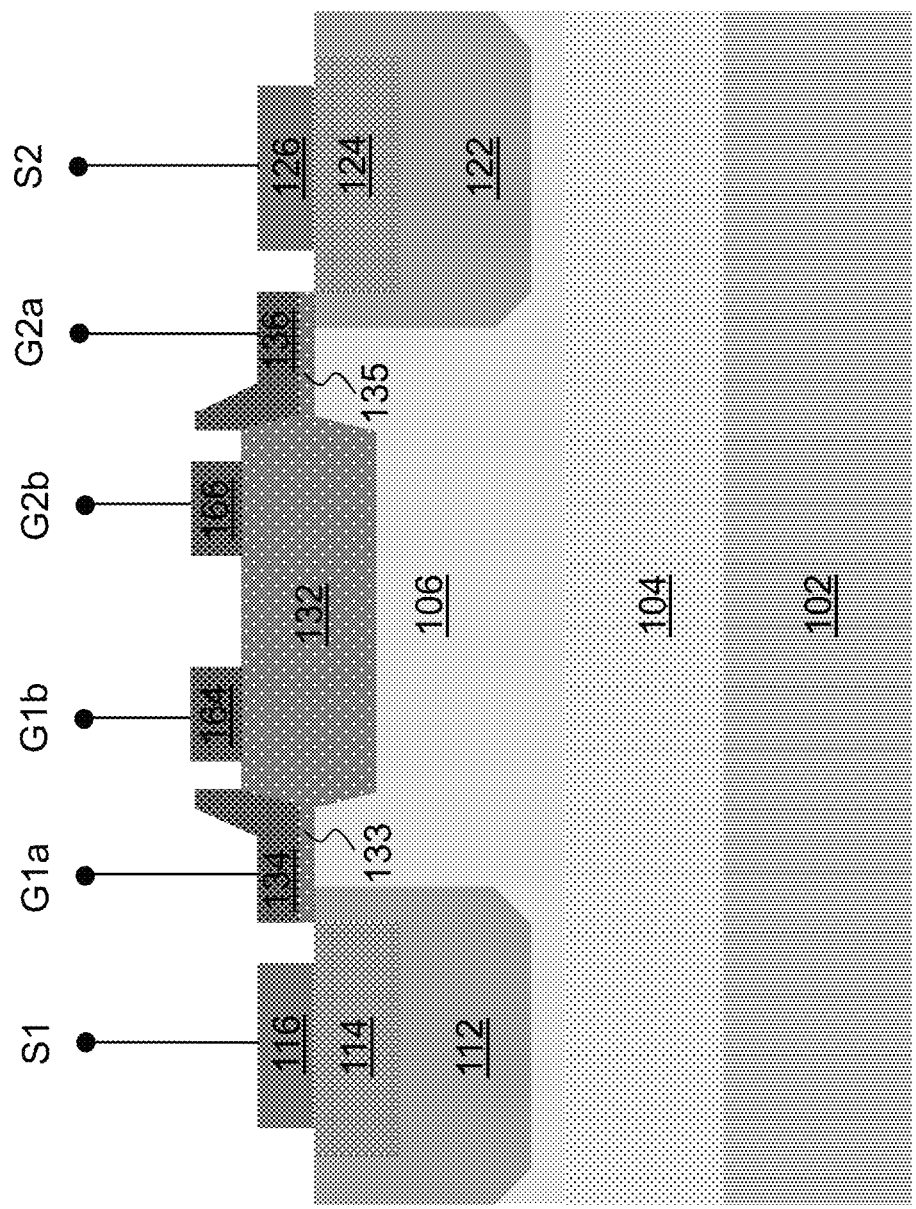
FIG. 13 illustrates a simplified cross-sectional view of a third implementation of the load switch shown in FIG. 10 in accordance with various embodiments of the present disclosure.

FIG. 13 illustrates a simplified cross-sectional view of a third implementation of the load switch shown in FIG. 10 in accordance with various embodiments of the present disclosure. The simplified cross-sectional view shown in FIG. 13 is similar to that shown in FIG. 11 except that the third gate 164 and the fourth gate 166 are formed over an LOCOS structure.

As shown in FIG. 13, the third gate 164 and the fourth gate 166 are formed between the first gate 134 and the second gate 136. The LOCOS structure 132 is formed over the substrate 102. A lower portion of the LOCOS structure 132 is below a top surface of the drain/source region (e.g., 114) and an upper portion of the LOCOS structure 132 is over the top surface of the drain/source region (e.g., 114).

A first gate dielectric layer 133 is formed between the LOCOS structure 132 and the first drain/source region 114. A second gate dielectric layer 135 is formed between the LOCOS structure 132 and the second drain/source region 124. The first gate 134 is formed over the first gate dielectric layer 133 and a first sidewall of the LOCOS structure 132. The second gate 136 is formed over the second gate dielectric layer 135 and a second sidewall of the LOCOS structure 132. The third gate 164 and the fourth gate 166 are formed on top of the LOCOS structure 132. As shown in FIG. 13, the third gate 164 and the fourth gate 166 are separated from each other.

Figure 14:
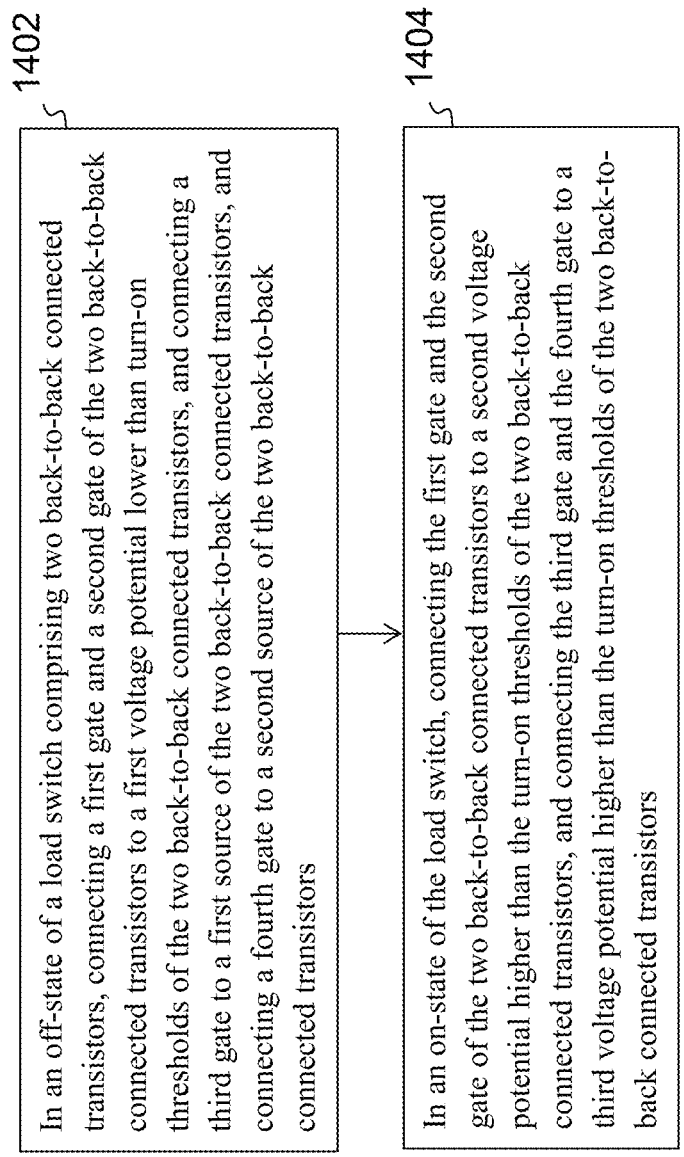
FIG. 14 illustrates a flow chart of a method for controlling the load switch shown in FIG. 10 in accordance with various embodiments of the present disclosure.

FIG. 14 illustrates a flow chart of a method for controlling the load switch shown in FIG. 10 in accordance with various embodiments of the present disclosure. This flowchart shown in FIG. 14 is merely an example, which should not unduly limit the scope of the claims. One of ordinary skill in the art would recognize many variations, alternatives, and modifications. For example, various steps illustrated in FIG. 14 may be added, removed, replaced, rearranged and repeated.

Referring back to FIG. 10, the shared-drain transistors comprise two back-to-back connected N-type transistors. A first transistor comprises a first drain D1, a first gate G1a, a third gate G1b and a first source S1. A second transistor comprises a second drain D2, a second gate G2a, a fourth gate G2b and a second source S2. The drains of these two N-type transistors are directly connected to each other as shown in FIG. 10. The back-to-back connected N-type transistors shown in FIG. 10 can be used as a load switch. The load switch is able to achieve bidirectional current blocking. In addition, the load switch is able to achieve low resistive conducting in the other state (when the load switch is turned on).

At step 1402, in an off-state of the load switch, the first gate and the second gate of the two back-to-back connected transistors are connected to a first voltage potential lower than turn-on thresholds of the two back-to-back connected transistors. The third gate is connected to the first source of the two back-to-back connected transistors. The fourth gate is connected to the second source of the two back-to-back connected transistors.

At step 1404, in an on-state of the load switch, the first gate and the second gate of the two back-to-back connected transistors are connected to a second voltage potential higher than the turn-on thresholds of the two back-to-back connected transistors. The third gate and the fourth gate are connected to a third voltage potential higher than the turn-on thresholds of the two back-to-back connected transistors.

Figure 15:
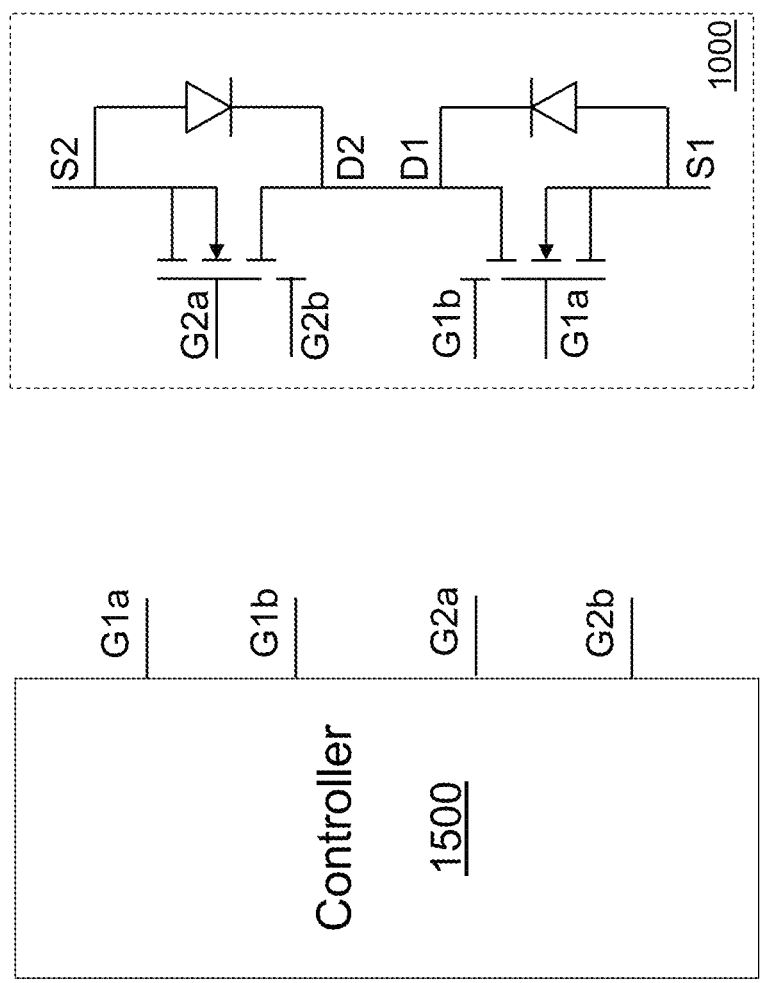
FIG. 15 illustrates a controller for driving the load switch shown in FIG. 10 in accordance with various embodiments of the present disclosure.

FIG. 15 illustrates a controller for driving the load switch shown in FIG. 10 in accordance with various embodiments of the present disclosure. The controller 1500 comprises a first gate driver, a second a gate driver, a third gate driver and a fourth gate driver. The first gate driver is configured to generate a first gate drive signal applied to the first gate G1a of the first transistor. The second gate driver is configured to generate a second gate drive signal applied to the second gate G2a of the second transistor. The third gate driver is configured to generate a third gate drive signal applied to the third gate G1b of the first transistor. The fourth gate driver is configured to generate a fourth gate drive signal applied to the fourth gate G2b of the second transistor.

In operation, the first gate driver is configured to apply a first voltage potential to the first gate of the load switch in an off-state of the load switch, and apply a second voltage potential to the first gate of the load switch in an on-state of the load switch. The first voltage potential is lower than a turn-on threshold of the first switch of the load switch. The second voltage potential is higher than the turn-on threshold of the first switch of the load switch.

In operation, the second gate driver is configured to apply the first voltage potential to a second gate of the load switch in the off-state of the load switch, and apply the second voltage potential to the second gate of the load switch in the on-state of the load switch. The first voltage potential is lower than a turn-on threshold of the second switch of the load switch. The second voltage potential is higher than the turn-on threshold of the second switch of the load switch.

In operation, the third gate driver is configured to connect the third gate of the load switch to the first source of the load switch in the off-state of the load switch, and apply a third voltage potential to the third gate of the load switch in the on-state of the load switch. The third voltage potential is higher than the turn-on threshold of the first switch of the load switch.

In operation, the fourth gate driver is configured to connect the fourth gate of the load switch to the second source of the load switch in the off-state of the load switch, and apply the third voltage potential to the fourth gate of the load switch in the on-state of the load switch. The third voltage potential is higher than the turn-on threshold of the second switch of the load switch.

Figure 16:
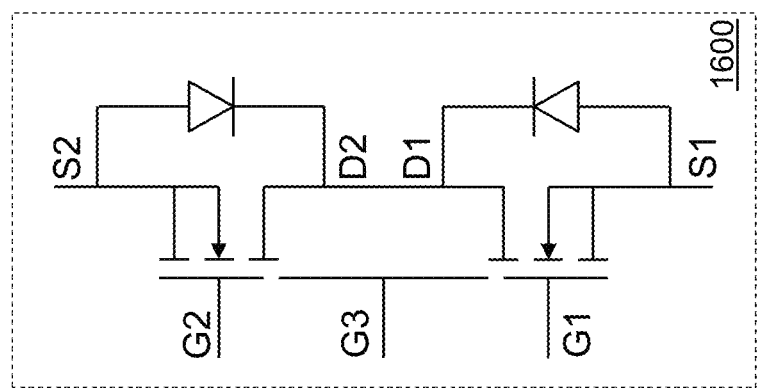
FIG. 16 illustrates a schematic diagram of another load switch having a split-gate structure in accordance with various embodiments of the present disclosure.

FIG. 16 illustrates a schematic diagram of another load switch having a split-gate structure in accordance with various embodiments of the present disclosure. The load switch 1600 is similar to the load switch 1000 shown in FIG. 10 except that the third gate and the fourth gate are merged into one single gate. As shown in FIG. 16, the load switch 1600 has three gates, namely a first gate G1, a second gate G2 and a third gate G3.

In operation, in an off-state of the load switch 1600, the first gate G1 and the second gate G2 are connected to a first voltage potential lower than the turn-on thresholds of these two transistors. The third gate G3 is connected to one source of the two sources of the load switch 1600. The third gate G3 is used as a field plate to provide the high voltage blocking capability. In some embodiments, when a voltage potential coupled to S1 is lower than a voltage potential coupled to S2, the third gate G3 is connected to S1. On the other hand, when a voltage potential coupled to S1 is higher than a voltage potential coupled to S2, the third gate G3 is connected to S2.

In operation, in an on-state of the load switch 1600, the first gate G1 and the second gate G2 are connected to a second voltage potential higher than the turn-on thresholds of these two transistors. The third gate G3 is connected to a third voltage potential higher than the turn-on thresholds of these two transistors. The third gate G3 is used as one additional gate to minimize the on resistance of the load switch 1600.

In some embodiments, the third voltage potential is equal to the second voltage potential. Alternatively, the third voltage potential is higher than the second voltage potential. The higher gate drive voltage applied to the third gate G3 helps to further reduce the on resistance of the load switch 1600.

Furthermore, in order to further improve the performance (e.g., power losses) of the load switch 1600, the gate drive signals may be applied to these three gates sequentially. In particular, in the on-state of the load switch 1600, the first gate G1 and the second gate G2 are connected to the second voltage potential prior to connecting the third gate G3 to the third voltage potential. In the off-state of the load switch 1600, the third gate G3 is connected to the source prior to connecting the first gate G1 and the second gate G2 to the first voltage potential.

Figure 17:
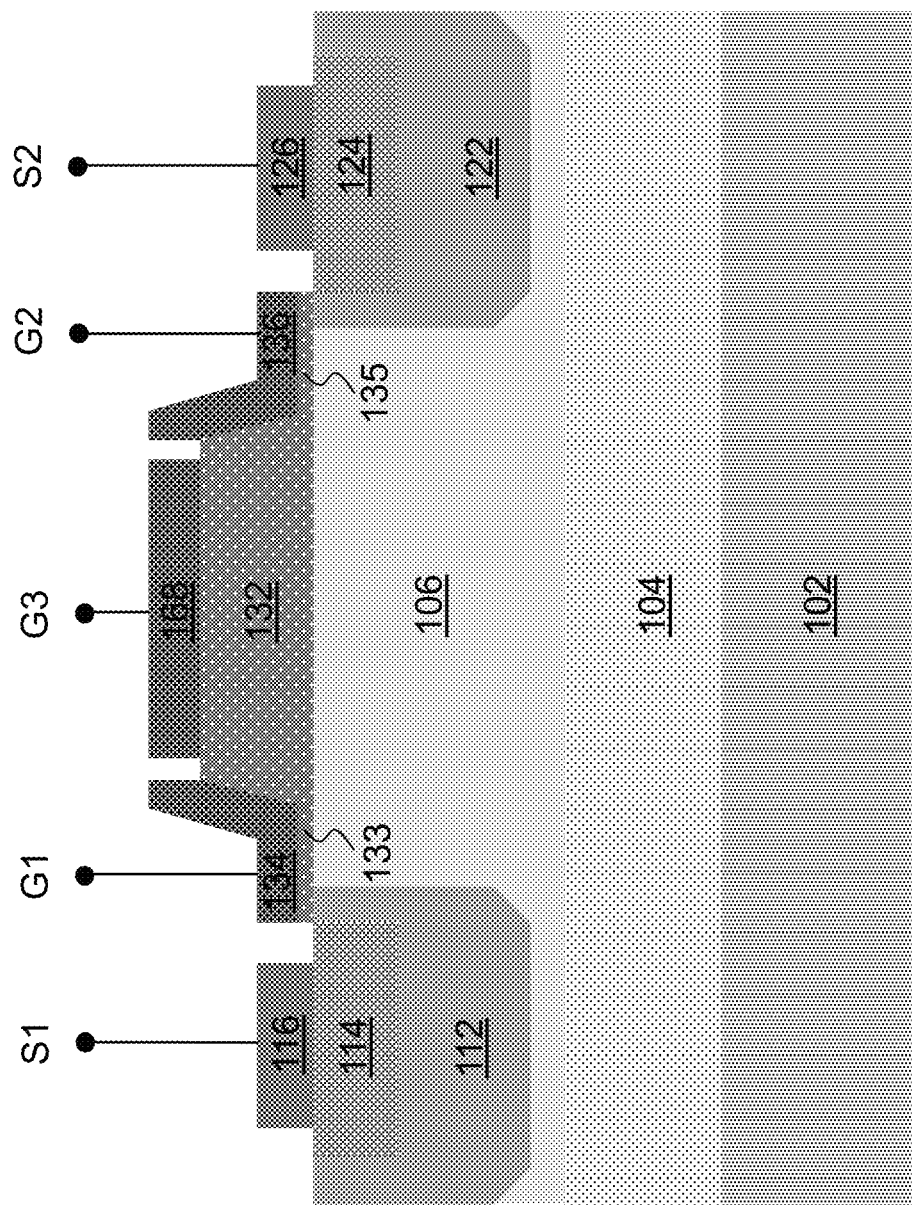
FIG. 17 illustrates a simplified cross-sectional view of a first implementation of the load switch shown in FIG. 16 in accordance with various embodiments of the present disclosure.

FIG. 17 illustrates a simplified cross-sectional view of a first implementation of the load switch shown in FIG. 16 in accordance with various embodiments of the present disclosure. The simplified cross-sectional view shown in FIG. 17 is similar to that shown in FIG. 11 except that that the third gate and the fourth gate have been merged into one single gate.

As shown in FIG. 17, a high voltage oxide region 132 is formed over a substrate 102. A first gate dielectric layer 133 is formed between the high voltage oxide region 132 and a first drain/source region 114. A second gate dielectric layer 135 is formed between the high voltage oxide region 132 and the second drain/source region 124.

The first gate 134 is formed over the first gate dielectric layer 133 and a first sidewall of the high voltage oxide region 132. The second gate 136 formed over the second gate dielectric layer 135 and a second sidewall of the high voltage oxide region 132. The third gate 168 is formed on top of the high voltage oxide region 132. The third gate 168 occupies a center of a top surface of the high voltage oxide region 132.

Figure 18:
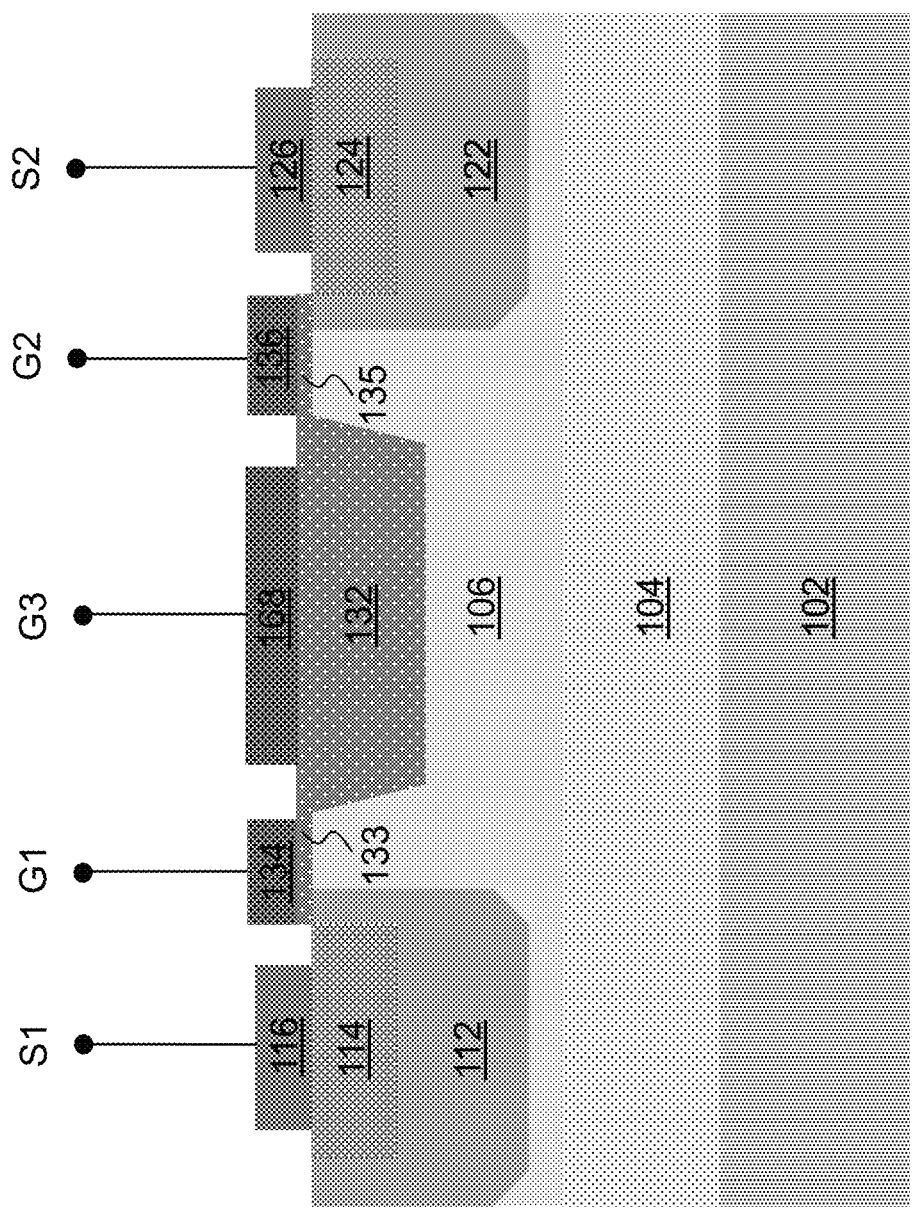
FIG. 18 illustrates a simplified cross-sectional view of a second implementation of the load switch shown in FIG. 16 in accordance with various embodiments of the present disclosure.

FIG. 18 illustrates a simplified cross-sectional view of a second implementation of the load switch shown in FIG. 16 in accordance with various embodiments of the present disclosure. The simplified cross-sectional view shown in FIG. 18 is similar to that shown in FIG. 12 except that that the third gate and the fourth gate have been merged into one single gate.

As shown in FIG. 18, a first gate dielectric layer 133 is formed between the STI region 132 and the first drain/source region 114. A second gate dielectric layer 135 is formed between the STI region 132 and the second drain/source region 124. The third gate 168 is formed between the first gate 134 and the second gate 136. The STI region 132 is formed over the substrate 102. The first gate 134 is over the first gate dielectric layer 133. In particular, the first gate 134 extends from an edge of the first drain/source region 114 and covers a first edge region of the STI region 132. The second gate 136 is over the second gate dielectric layer 135. In particular, the second gate 136 extends from an edge of the second drain/source region 124 and covers a second edge region of the STI region 132. The third gate 168 occupies a center of a top surface of the STI region 132.

Figure 19:
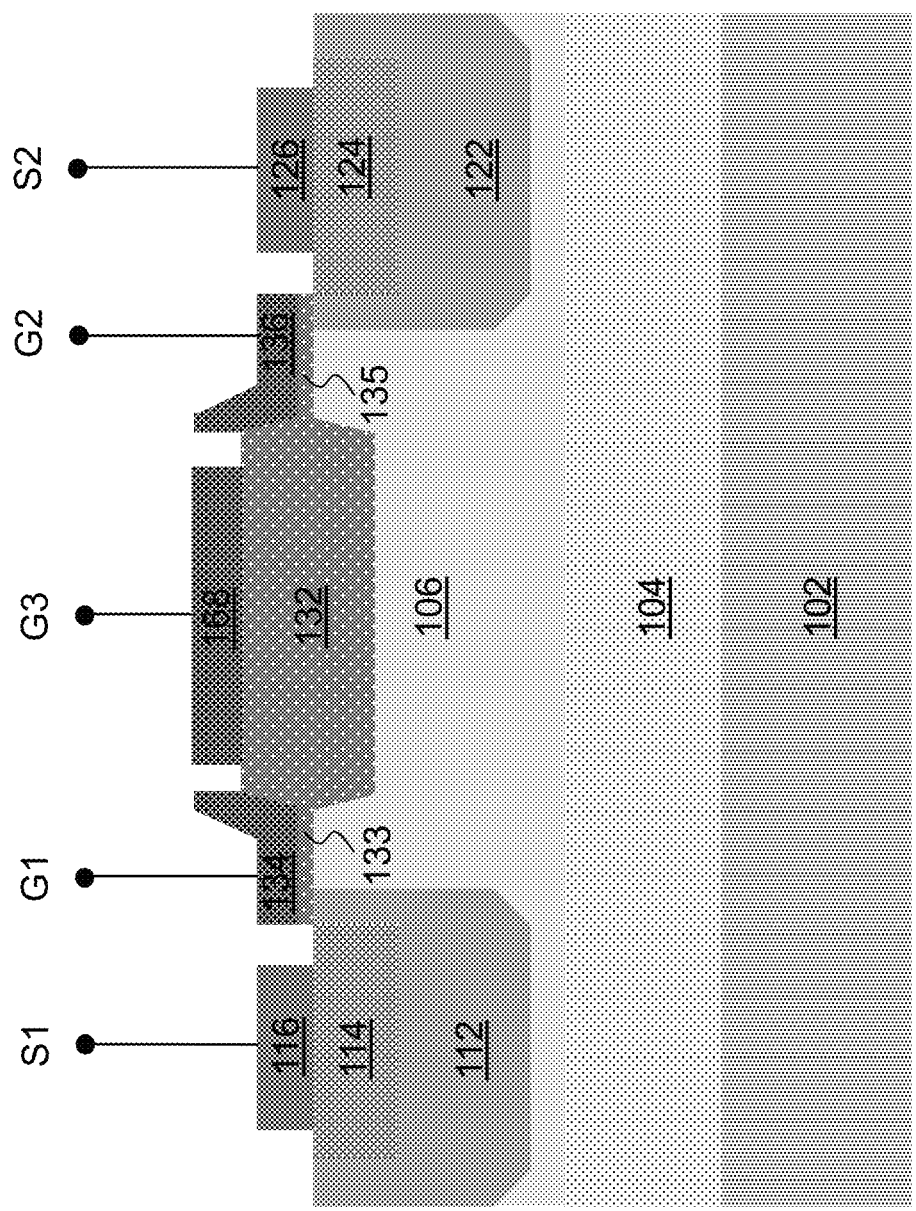
FIG. 19 illustrates a simplified cross-sectional view of a third implementation of the load switch shown in FIG. 16 in accordance with various embodiments of the present disclosure.

FIG. 19 illustrates a simplified cross-sectional view of a third implementation of the load switch shown in FIG. 16 in accordance with various embodiments of the present disclosure. The simplified cross-sectional view shown in FIG. 19 is similar to that shown in FIG. 13 except that that the third gate and the fourth gate have been merged into one single gate.

As shown in FIG. 19, the third gate 168 is formed between the first gate 134 and the second gate 136. The LOCOS structure 132 is formed over the substrate 102. A lower portion of the LOCOS structure 132 is below a top surface of the drain/source region (e.g., 114) and an upper portion of the LOCOS structure 132 is over the top surface of the drain/source region (e.g., 114).

A first gate dielectric layer 133 is formed between the LOCOS structure 132 and the first drain/source region 114. A second gate dielectric layer 135 is formed between the LOCOS structure 132 and the second drain/source region 124. The first gate 134 is formed over the first gate dielectric layer 133 and a first sidewall of the LOCOS structure 132. The second gate 136 is formed over the second gate dielectric layer 135 and a second sidewall of the LOCOS structure 132. The third gate 168 is formed on top of the LOCOS structure 132. As shown in FIG. 19, the third gate 168 occupies a center of a top surface of the LOCOS structure 132.

Figure 20:
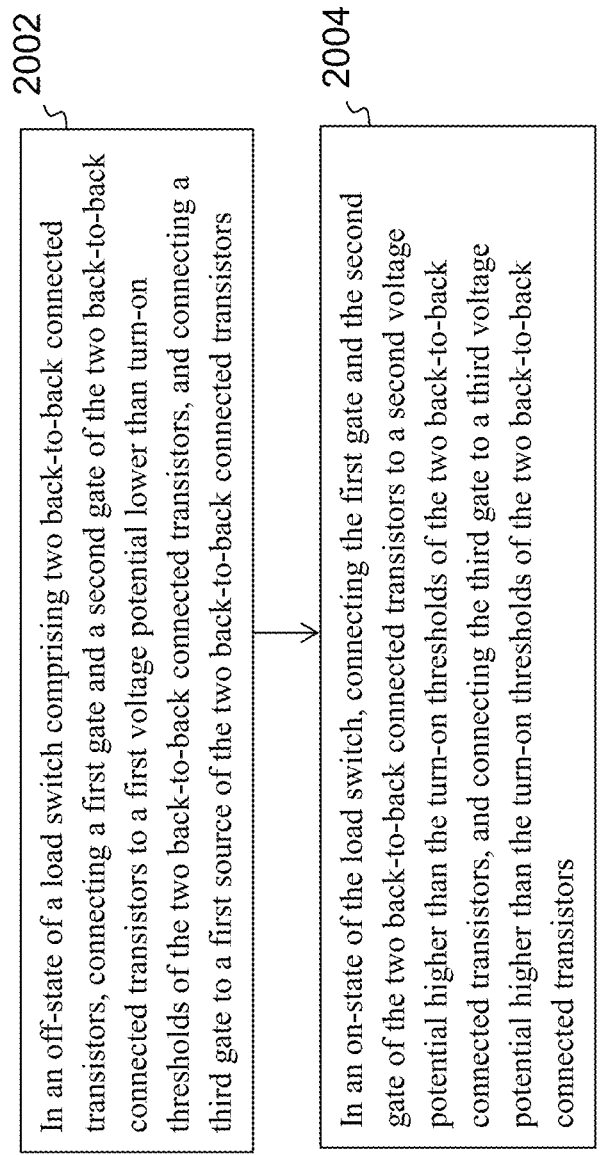
FIG. 20 illustrates a flow chart of a method for controlling the load switch shown in FIG. 16 in accordance with various embodiments of the present disclosure.

FIG. 20 illustrates a flow chart of a method for controlling the load switch shown in FIG. 16 in accordance with various embodiments of the present disclosure. This flowchart shown in FIG. 20 is merely an example, which should not unduly limit the scope of the claims. One of ordinary skill in the art would recognize many variations, alternatives, and modifications. For example, various steps illustrated in FIG. 20 may be added, removed, replaced, rearranged and repeated.

Referring back to FIG. 16, the shared-drain transistors comprise two back-to-back connected N-type transistors. A first transistor comprises a first drain D1, a first gate G1, and a first source S1. A second transistor comprises a second drain D2, a second gate G2, and a second source S2. Furthermore, the first transistor and the second transistor share a third gate G3. The drains of these two N-type transistors are directly connected to each other as shown in FIG. 16. The back-to-back connected N-type transistors shown in FIG. 16 can be used as a load switch. The load switch is able to achieve bidirectional current blocking. In addition, the load switch is able to achieve low resistive conducting in the other state (when the load switch is turned on).

At step 2002, in an off-state of the load switch, the first gate and the second gate of the two back-to-back connected transistors are connected to a first voltage potential lower than turn-on thresholds of the two back-to-back connected transistors. The third gate is connected to one source of the two sources of the two back-to-back connected transistors.

At step 2004, in an on-state of the load switch, the first gate and the second gate of the two back-to-back connected transistors are connected to a second voltage potential higher than the turn-on thresholds of the two back-to-back connected transistors. The third gate is connected to a third voltage potential higher than the turn-on thresholds of the two back-to-back connected transistors.

Figure 21:
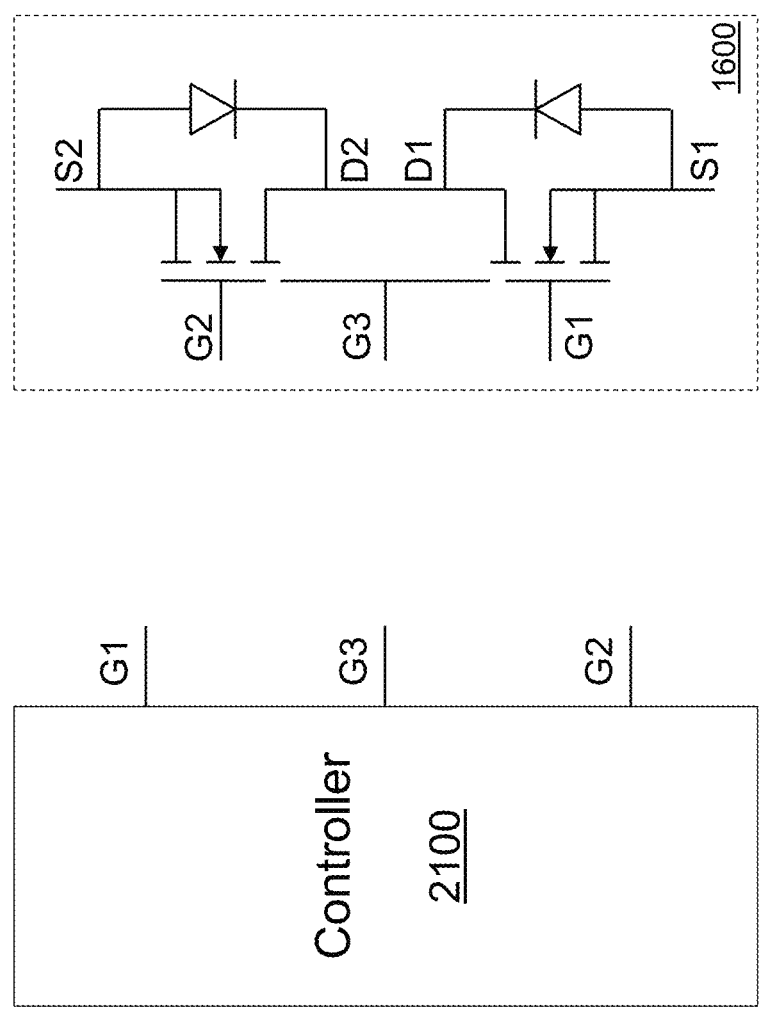
FIG. 21 illustrates a controller for driving the load switch shown in FIG. 16 in accordance with various embodiments of the present disclosure.

FIG. 21 illustrates a controller for driving the load switch shown in FIG. 16 in accordance with various embodiments of the present disclosure. The controller 2100 comprises a first gate driver, a second a gate driver and a third gate driver. The first gate driver is configured to generate a first gate drive signal applied to the first gate G1 of the first transistor. The second gate driver is configured to generate a second gate drive signal applied to the second gate G2 of the second transistor. The third gate driver is configured to generate a third gate drive signal applied to the third gate G3 shared by the first transistor and the second transistor.

In operation, the first gate driver is configured to apply a first voltage potential to the first gate of the load switch in an off-state of the load switch, and apply a second voltage potential to the first gate of the load switch in an on-state of the load switch. The first voltage potential is lower than a turn-on threshold of the first switch of the load switch. The second voltage potential is higher than the turn-on threshold of the first switch of the load switch.

In operation, the second gate driver is configured to apply the first voltage potential to the second gate of the load switch in the off-state of the load switch, and apply the second voltage potential to the second gate of the load switch in the on-state of the load switch. The first voltage potential is lower than a turn-on threshold of the second switch of the load switch. The second voltage potential is higher than the turn-on threshold of the second switch of the load switch.

In operation, the third gate driver is configured to connect the third gate of the load switch to one source of the two sources of the load switch in the off-state of the load switch, and apply a third voltage potential to the third gate of the load switch in the on-state of the load switch. The third voltage potential is higher than the turn-on threshold of the first switch of the load switch of the two back-to-back connected transistors.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:

in an off-state of a load switch comprising two back-to-back connected transistors including a first gate, a second gate and a third gate formed over and in direct contact with a continuous dielectric layer, connecting the first gate and the second gate of the two back-to-back connected transistors to a first voltage potential lower than turn-on thresholds of the two back-to-back connected transistors, and connecting the third gate to a first source of the two back-to-back connected transistors; and in an on-state of the load switch, connecting the first gate and the second gate of the two back-to-back connected transistors to a second voltage potential higher than the turn-on thresholds of the two back-to-back connected transistors, and connecting the third gate to a third voltage potential higher than the turn-on thresholds of the two back-to-back connected transistors.

2. The method of claim 1, further comprising:
in the off-state of the load switch, connecting a fourth gate to a second source of the two back-to-back connected transistors; and
in the on-state of the load switch, connecting the fourth gate to the third voltage potential, wherein the two back-to-back connected transistors comprise:
the first source and the second source over a substrate;
the first gate adjacent to the first source;
the second gate adjacent to the second source;
a high voltage oxide region over the substrate;
a first gate dielectric layer formed between the high voltage oxide region and the first source; and
a second gate dielectric layer formed between the high voltage oxide region and the second source, and wherein:
the first gate is formed over the first gate dielectric layer and a first sidewall of the high voltage oxide region;
the second gate is formed over the second gate dielectric layer and a second sidewall of the high voltage oxide region; and
the third gate and the fourth gate are formed on top of the high voltage oxide region, and wherein the third gate and the fourth gate are separated from each other.

3. The method of claim 1, further comprising:
in the off-state of the load switch, connecting a fourth gate to a second source of the two back-to-back connected transistors; and
in the on-state of the load switch, connecting the fourth gate to the third voltage potential, wherein the two back-to-back connected transistors comprise:
the first source and the second source over a substrate;
the first gate adjacent to the first source;
the second gate adjacent to the second source; and
an STI region over the substrate, and wherein:
the first gate extends from an edge of the first source and covers a first edge region of the STI region;
the second gate extends from an edge of the second source and covers a second edge region of the STI region; and
the third gate and the fourth gate are formed on top of the STI region, and wherein the third gate and the fourth gate are separated from each other.

4. The method of claim 1, further comprising:
in the off-state of the load switch, connecting a fourth gate to a second source of the two back-to-back connected transistors; and
in the on-state of the load switch, connecting the fourth gate to the third voltage potential, wherein the two back-to-back connected transistors comprise:
the first source and the second source over a substrate;
the first gate adjacent to the first source;
the second gate adjacent to the second source;
a local oxidation of silicon (LOCOS) structure having a lower portion below a top surface of the first source and an upper portion over the top surface of the first source;
a first gate dielectric layer formed between the LOCOS structure and the first source; and
a second gate dielectric layer formed between the LOCOS structure and the second source, wherein:
the first gate is formed over the first gate dielectric layer and a first sidewall of the LOCOS structure;
the second gate is formed over the second gate dielectric layer and a second sidewall of the LOCOS structure; and
the third gate and the fourth gate are formed on top of the LOCOS structure, and wherein the third gate and the fourth gate are separated from each other.

5. The method of claim 1, wherein:
a voltage coupled to the first source of the two back-to-back connected transistors is lower than a voltage coupled to a second source of the two back-to-back connected transistors.

6. The method of claim 1, wherein:
the third gate is formed over a dielectric region between the first source and a second source of the two back-to-back connected transistors;
the first source and the second source are arranged in a symmetrical manner with respect to a center of the dielectric region; and
the third gate occupies a center of a top surface of the dielectric region.

7. The method of claim 1, further comprising:
in the on-state of the load switch, connecting the first gate and the second gate of the two back-to-back connected transistors to the second voltage potential higher than the turn-on thresholds of the two back-to-back connected transistors prior to connecting the third gate to a third voltage potential higher than the turn-on thresholds of the two back-to-back connected transistors.

8. The method of claim 1, further comprising:
in an off-state of the load switch comprising, connecting the third gate to the first source of the two back-to-back connected transistors prior to connecting the first gate and the second gate of the two back-to-back connected transistors to the first voltage potential lower than turn-on the thresholds of the two back-to-back connected transistors.

9. A controller comprising:
a first gate driver configured to apply a first voltage potential to a first gate of a load switch in an off-state of the load switch, and apply a second voltage potential to the first gate of the load switch in an on-state of the load switch, wherein the first voltage potential is lower than a turn-on threshold of a first switch of the load switch, and the second voltage potential is higher than the turn-on threshold of the first switch of the load switch;
a second gate driver configured to apply the first voltage potential to a second gate of the load switch in the off-state of the load switch, and apply the second voltage potential to the second gate of the load switch in the on-state of the load switch; and
a third gate driver configured to connect a third gate of the load switch to a first source of the load switch in the off-state of the load switch, and apply a third voltage potential to the third gate of the load switch in the on-state of the load switch, wherein the third voltage potential is higher than the turn-on threshold of the first switch of the load switch, wherein the first gate, the second gate and the third gate are formed over and in direct contact with a continuous dielectric layer.

10. The controller of claim 9, further comprising:
a fourth gate driver configured to connect a fourth gate of the load switch to a second source of the load switch in the off-state of the load switch, and apply the third voltage potential to the fourth gate of the load switch in the on-state of the load switch.

11. The controller of claim 10, wherein:
the load switch comprises two back-to-back connected transistors;
the first source and the second source are arranged in a symmetrical manner with respect to a dielectric region formed between the first source and the second source; and
the first gate and the second gate are arranged in a symmetrical manner with respect to the dielectric region.

12. The controller of claim 11, wherein:
the first gate is formed over a first sidewall of the dielectric region;
the second gate is formed over a second sidewall of the dielectric region; and
the third gate and the fourth gate are formed on top of the dielectric region, and wherein the third gate and the fourth gate are separated from each other.

* * * * *